United States Patent
Kobayashi et al.

(10) Patent No.: US 11,975,391 B2
(45) Date of Patent: May 7, 2024

(54) CUTTING TOOL

(71) Applicant: Sumitomo Electric Industries, Ltd., Osaka (JP)

(72) Inventors: Fumiyoshi Kobayashi, Osaka (JP); Anongsack Paseuth, Osaka (JP); Haruko Harada, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/026,595

(22) PCT Filed: Aug. 30, 2022

(86) PCT No.: PCT/JP2022/032595
§ 371 (c)(1),
(2) Date: Mar. 16, 2023

(65) Prior Publication Data
US 2024/0066605 A1   Feb. 29, 2024

(51) Int. Cl.
*B23B 27/14* (2006.01)
*B23B 27/16* (2006.01)
*E21B 10/46* (2006.01)

(52) U.S. Cl.
CPC .......... *B23B 27/1611* (2013.01); *B23B 27/14* (2013.01); *E21B 10/46* (2013.01);
(Continued)

(58) Field of Classification Search
CPC ..... E21B 10/46; E21B 10/5676; B23B 27/14; B23B 2224/32
See application file for complete search history.

(56) References Cited

U.S. PATENT DOCUMENTS 11,813,677 B1 * 11/2023 Kobayashi ........ C04B 35/58021
2013/0115018 A1   5/2013 Layyous et al.
(Continued)

FOREIGN PATENT DOCUMENTS

JP          10-280148 A    10/1998
WO     2013/083447 A1     6/2013
(Continued)

OTHER PUBLICATIONS

Imamura et al., "Properties and cutting performance of AlTiCrN/TiSiCN bilayer coatings deposited by cathodic-arc ion plating", Surface and Coatings Technology, vol. 202, 2007, pp. 820-825.
(Continued)

*Primary Examiner* — Cathleen R Hutchins
(74) *Attorney, Agent, or Firm* — XSENSUS LLP

(57) ABSTRACT

A cutting tool including a substrate and a coating film disposed on the substrate, wherein the cutting tool includes: a rake face, a flank face contiguous to the rake face; and a cutting edge region composed of a boundary part between the rake face and the flank face, wherein the coating film includes a TiSiCN layer, the TiSiCN layer has: a first TiSiCN layer positioned in the rake face; and a second TiSiCN layer positioned in the cutting edge region, the first TiSiCN layer has a composition of $Ti_{(1-Xr)}Si_{Xr}CN$, the second TiSiCN layer has a composition of $Ti_{(1-Xe)}Si_{Xe}CN$, and the Xr and the Xe each represent 0.010 or more and 0.100 or less, and satisfy a relationship of $Xr-Xe \geq 0.003$.

6 Claims, 10 Drawing Sheets

(52) U.S. Cl.
CPC ....... *B23B 2200/08* (2013.01); *B23B 2224/36* (2013.01); *B23B 2228/105* (2013.01)

(56) References Cited

U.S. PATENT DOCUMENTS

| | | |
|---|---|---|
| 2014/0370309 A1 | 12/2014 | Endler et al. |
| 2015/0343535 A1 | 12/2015 | Sakamoto |
| 2020/0232100 A1 | 7/2020 | Endler et al. |

FOREIGN PATENT DOCUMENTS

| | | |
|---|---|---|
| WO | 2014/104111 A1 | 7/2014 |
| WO | 2018/146013 A1 | 8/2018 |

OTHER PUBLICATIONS

Wang et al., "Influence of bias voltage on structure and tribocorrosion properties of TiSiCN coating in artificial seawater", Materials Characterization, vol. 127, Mar. 2017, pp. 198-208.
Written Opinion dated Nov. 1, 2022, received for PCT Application PCT/JP2022/032595, filed on Aug. 30, 2022, 6 pages including English Translation.

\* cited by examiner

CUTTING TOOL

CROSS-REFERENCE TO RELATED APPLICATION

The present application is based on PCT filing PCT/JP2022/032595, filed Aug. 30, 2022, the entire contents of which are incorporated herein by reference.

TECHNICAL FIELD

The present disclosure relates to a cutting tool.

BACKGROUND ART

A cutting tool including a substrate and a coating film disposed on the substrate has been conventionally used for cutting process (PTL 1, PTL 2, and NPL 1).

CITATION LIST

Patent Literature

PTL 1: WO 2013/083447
PTL 2: WO 2018/146013

Non Patent Literature

NPL 1: Shinya Imamura et al., "Properties and cutting performance of AlTiCrN/TiSiCN bilayer coatings deposited by cathodic-arc ion plating", Surface and Coatings Technology, 202, (2007), 820-825

SUMMARY OF INVENTION

A cutting tool of the present disclosure is a cutting tool comprising a substrate and a coating film disposed on the substrate, wherein the cutting tool comprises:
 a rake face;
 a flank face contiguous to the rake face; and
 a cutting edge region composed of a boundary part between the rake face and the flank face, wherein
 the coating film includes a TiSiCN layer,
 the TiSiCN layer has:
  a first TiSiCN layer positioned in the rake face; and
  a second TiSiCN layer positioned in the cutting edge region,
 the first TiSiCN layer has a composition of $Ti_{(1-Xr)}Si_{Xr}CN$,
 the second TiSiCN layer has a composition of $Ti_{(1-Xe)}Si_{Xe}CN$, and the Xr and the Xe each represent 0.010 or more and 0.100 or less, and satisfy a relationship of $Xr-Xe \geq 0.003$.

DETAILED DESCRIPTION

Figure 1:
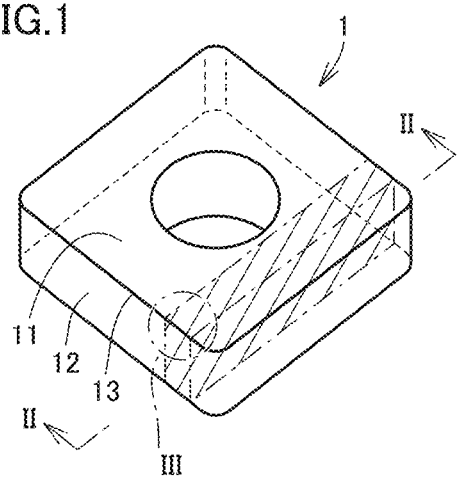
FIG. 1 is a perspective view illustrating an example of a cutting tool according to an embodiment of the present disclosure.

Problem to be Solved by the Present Disclosure

In recent years, requirement for improvement of a tool lifetime has been growing. In particular, in intermittent turning of steel, further improvement of the tool lifetime has been required. In particular, important factors for further improvement of the tool lifetime in the intermittent turning of steel include "wearing resistance" and "breakage resistance" In a cutting tool including a coating film including a TiSiCN layer, the TiSiCN layer has typically high hardness, and thereby tends to have excellent "wearing resistance". However, since containing a large amount of amorphous structures, the TiSiCN layer is vulnerable to load in the shearing direction and easily causes breakage triggered by film breakage in some cases. Thus, also in the intermittent turning of steel in particular, imparting both excellent "wearing resistance" and excellent "breakage resistance" is required to expand the tool lifetime.

Advantageous Effect of the Present Disclosure

According to the present disclosure, in the intermittent turning of steel in particular, a cutting tool having a long tool lifetime can be provided.

DESCRIPTION OF EMBODIMENTS

First, the aspect of the present disclosure will be listed and described.

(1) A cutting tool of the present disclosure is a cutting tool comprising a substrate and a coating film disposed on the substrate, wherein the cutting tool comprises:
a rake face;
a flank face contiguous to the rake face, and
a cutting edge region composed of a boundary part between the rake face and the flank face, wherein
the coating film includes a TiSiCN layer.
the TiSiCN layer has.
a first TiSiCN layer positioned in the rake face; and
a second TiSiCN layer positioned in the cutting edge region,
the first TiSiCN layer has a composition of $Ti_{(1-Xr)}Si_{Xr}CN$,
the second TiSiCN layer has a composition of $Ti_{(1-Xe)}Si_{Xe}CN$, and
the Xr and the Xe each represent 0.010 or more and 0.100 or less, and satisfy a relationship of Xr−Xe≥0.003.

According to the present disclosure, in the intermittent turning of steel in particular, a cutting tool having a long tool lifetime can be provided.

(2) According to the above (1), it is preferable that the TiSiCN layer be composed of a plurality of hard particles, and
the hard particles have a lamellar structure in which a layer with a relatively high silicon concentration and a layer with a relatively low silicon concentration are alternately stacked. According to this, in the intermittent turning of steel in particular, a cutting tool can have a longer tool lifetime.

(3) According to the above (2), it is preferable that an average of periodic widths of the lamellar structure be 3 nm or more and 20 nm or less. According to this, in the intermittent turning of steel in particular, a cutting tool can have a longer tool lifetime.

(4) According to any of the above (1) to (3), it is preferable that the TiSiCN layer have a pillar structure According to this, in the intermittent turning of steel in particular, a cutting tool can have a longer tool lifetime.

(5) According to any of the above (1) to (4), it is preferable that the TiSiCN layer have 90 vol % or more of a cubic crystalline structure. According to this, in the intermittent turning of steel in particular, a cutting tool can have a longer tool lifetime.

(6) According to any of the above (1) to (5), it is preferable that the TiSiCN layer have a thickness of 2.0 μm or more and 15 μm or less According to this, in the intermittent turning of steel in particular, a cutting tool can have a longer tool lifetime.

DETAIL OF THE PRESENT EMBODIMENTS

With reference to the drawings, a specific example of a cutting tool of an embodiment of the present disclosure (hereinafter, also referred to as "the present embodiment") will be described hereinafter. In the drawings of the present disclosure, a same reference sign represents a same part or a corresponding part. Dimensions such as length, width, thickness, and depth are appropriately modified to clarify and simplify the drawings, and do not always represent actual dimensions.

A description of a form "A to B" herein means an upper and lower limits of a range (that is, A or more and B or less). When A has no description of a unit and only B has a description of a unit, the unit of A and the unit of B are same.

When a compound and the like are represented by a chemical formula herein, any conventionally known atomic ratios are included unless the atomic ratio is particularly limited, and should not be necessarily limited to an atomic ratio within a stoichiometric range. For example, when "TiN" is described, a ratio of numbers of atoms that constitute TiN includes any conventionally known atomic ratios.

Embodiment 1: Cutting Tool

With reference to FIGS. 1 to 13 and 19, a cutting tool according to an embodiment of the present disclosure will be described.

An embodiment of the present disclosure (hereinafter, also referred to as "the present embodiment") is a cutting tool 1 comprising a substrate 2 and a coating film 3 disposed on substrate 2, wherein cutting tool 1 comprises:
a rake face 11;
a flank face 12 contiguous to rake face 11; and
a region of a cutting edge 13 composed of a boundary part between rake face 11 and flank face 12, wherein
coating film 3 includes a TiSiCN layer 30,
TiSiCN layer 30 has:
a first TiSiCN layer positioned in rake face 11; and
a second TiSiCN layer positioned in the region of cutting edge 13,
the first TiSiCN layer has a composition of $Ti_{(1-Xr)}Si_{Xr}CN$,
the second TiSiCN layer has a composition of $Ti_{(1-Xe)}Si_{Xe}CN$, and
the Xr and the Xe each represent 0.010 or more and 0.100 or less, and satisfy a relationship of Xr−Xe≥0.003.

According to the present disclosure, in the intermittent turning of steel in particular, cutting tool 1 having a long tool lifetime can be provided. It is presumed that the reason is as follows.

The Xr and the Xe each represent 0.010 or more and 0.100 or less, and satisfy a relationship of Xr−Xe≥0.003. When Xr and Xe are within the range of 0.10 or less, larger values of Xr and Xe (in other word, higher Si concentrations) tend to increase hardness with nanoindentation and improve the "wearing resistance". Meanwhile, the "breakage resistance" tends to easily decrease due to deterioration in toughness. In the intermittent turning of steel in particular, since cracking of the region of cutting edge 13 easily occurs due to mechanical impact, high toughness ("breakage resistance") in the region of cutting edge 13 is required. In cutting tool 1 of the present disclosure, since the Xr and the Xe each represent 0.010 or more and 0.100 or less, TiSiCN layer 30 can entirely has an appropriate hardness, and can have excellent "wearing resistance". In cutting tool 1 of the present disclosure, since the Xr and the Xe satisfy the relationship of Xr−Xe≥0.003, a Si concentration in the region of cutting edge 13 can be relatively reduced, and in particular, the region of cutting edge 13 can have high toughness ("breakage resistance").

That is, according to the present disclosure, both of the excellent "wearing resistance" and the excellent "breakage resistance" can be imparted to the cutting tool, and thereby in the intermittent turning of steel in particular, a cutting tool having a long tool lifetime can be provided.

<<Structure of Cutting Tool>>

As illustrated in FIG. 1, cutting tool 1 of the present disclosure has surfaces including an upper face, a lower face, and four side faces, and cutting tool 1 has a quadrangular prism shape that is slightly short in the vertical direction as an entirety. In cutting tool 1, a through hole that penetrates the upper and lower faces is formed. Of boundary parts of the four side faces of cutting tool 1, the adjacent side faces are connected to each other with an arc face.

In cutting tool 1 of the present embodiment, the upper face and the lower face constitute for rake face 11, and the four side faces (and the arc parts that connect these faces) constitute for flank face 12. The boundary part between rake face 11 and flank face 12 functions as the region of cutting edge 13. In other words, the surface (the upper face, the lower face, the four side faces, the arc faces that connect these side faces, and inner spherical face of the through hole) of cutting tool 1 of the present embodiment includes rake face 11, flank face 12 contiguous to rake face 11, and the region of cutting edge 13 composed of the boundary part between rake face 11 and flank face 12.

The boundary part between rake face 11 and flank face 12, that is the region of cutting edge 13, means "a combined part of: a ridgeline E that constitutes the boundary between rake face 11 and flank face 12; and a part proximity to ridgeline E in rake face 11 and flank face 12". "The part proximity to ridgeline E in rake face 11 and flank face 12" is determined by a shape of cutting edge 13 of cutting tool 1. Hereinafter, cases where cutting tool 1 is a tool that has a sharp-edge shape, a hone-processed tool that has a honed shape, and a negative-land-processed tool that has a negative-land-processed shape will be described.

Figure 2:
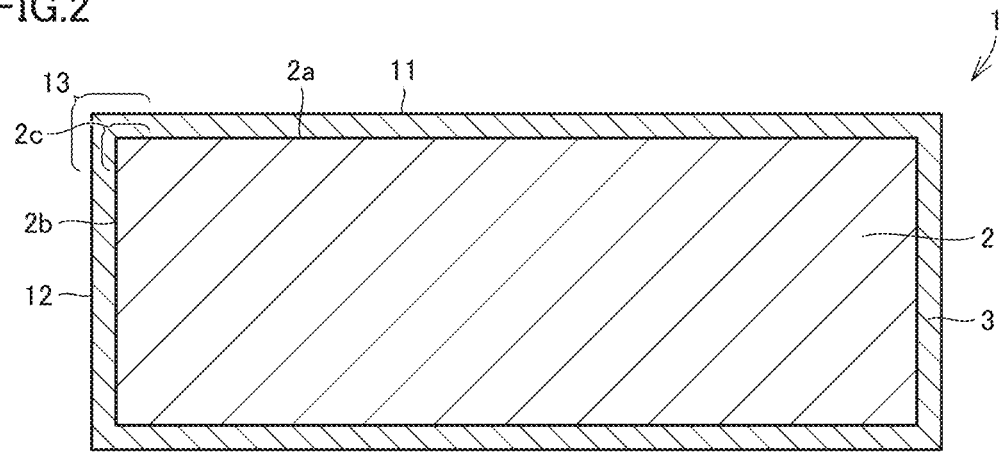
FIG. 2 is a sectional view of the cutting tool in FIG. 1, and is a sectional view viewed from the arrow direction of the II-II line in FIG. 1.
Figure 3:
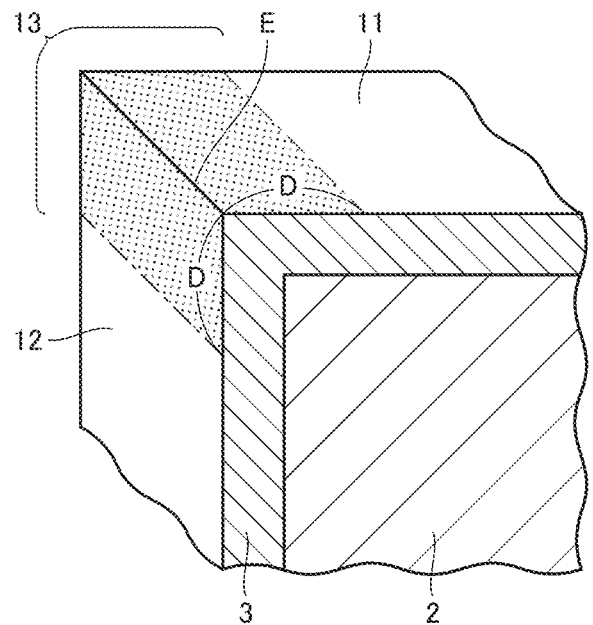
FIG. 3 is a view illustrating the hatched area in FIG. 1, and is a sectional perspective view illustrating the III region.

FIG. 2 and FIG. 3 illustrate cutting tool 1 that has a sharp-edge shape. In cutting tool 1 that has such a sharp-edge shape, "the part proximity to ridgeline E in rake face 11 and flank face 12" is defined as a region within a distance (linear distance) D from ridgeline E of 50 μm or less (the dot-hatched region in FIG. 3). Therefore, the region of cutting edge 13 in cutting tool 1 that has a sharp-edge shape is a part corresponding to the dot-hatched region in FIG. 3.

Figure 4:
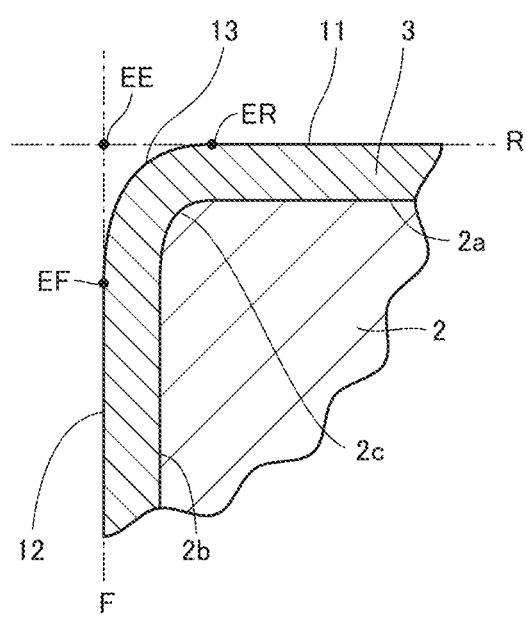
FIG. 4 is a partial view of the sectional view illustrated in FIG. 2 in a case where a cutting edge is hone-processed.
Figure 5:
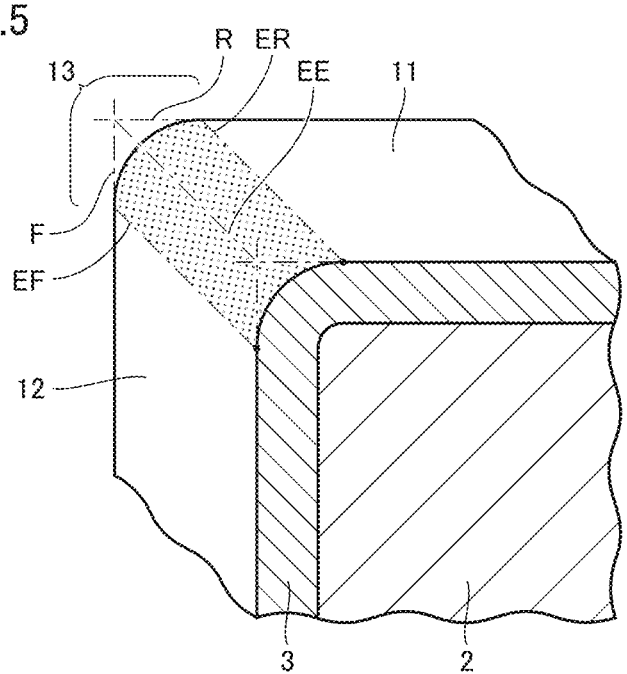
FIG. 5 is a sectional perspective view of the sectional perspective view illustrated in FIG. 3 in a case where a cutting edge is hone-processed.

FIG. 4 and FIG. 5 illustrate hone-processed cutting tool 1 that has a honed shape. FIG. 4 and FIG. 5 illustrate, in addition to each of the parts of cutting tool 1, an imaginary plane R that includes rake face 11, an imaginary plane F that includes flank face 12, an imaginary ridgeline EE formed by crossing imaginary plane R and imaginary plane F, an imaginary boundary line ER to be a boundary of deviation between rake face 11 and imaginary plane R, and an imaginary boundary line EF to be a boundary of deviation between flank face 12 and imaginary plane F. In cutting tool 1 that has a honed shape, "ridgeline E" is replaced for "imaginary ridgeline EE".

In cutting tool 1 that has such a honed shape, "the part proximity to imaginary ridgeline EE in rake face 11 and flank face 12" is defined as a region sandwiched by imaginary boundary line ER and imaginary boundary line EF (the dot-hatched region in FIG. 5). Therefore, the region of cutting edge 13 in cutting tool 1 that has a honed shape is a part corresponding to the dot-hatched region in FIG. 5.

Figure 6:
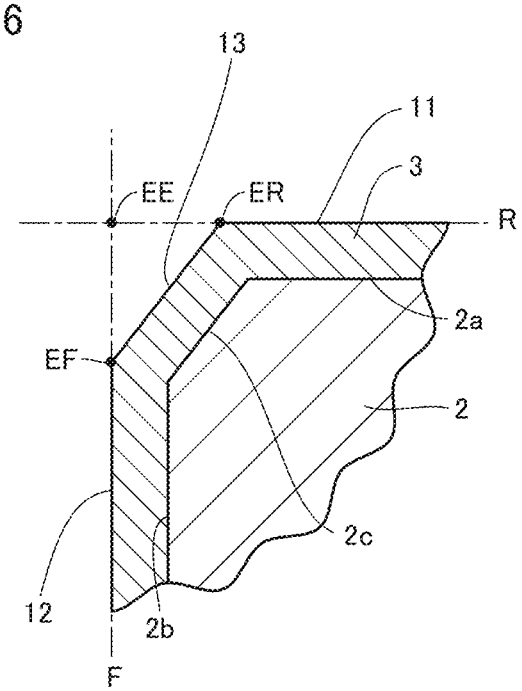
FIG. 6 is a partial view of the sectional view illustrated in FIG. 2 in a case where a cutting edge is negative-land-processed.
Figure 7:
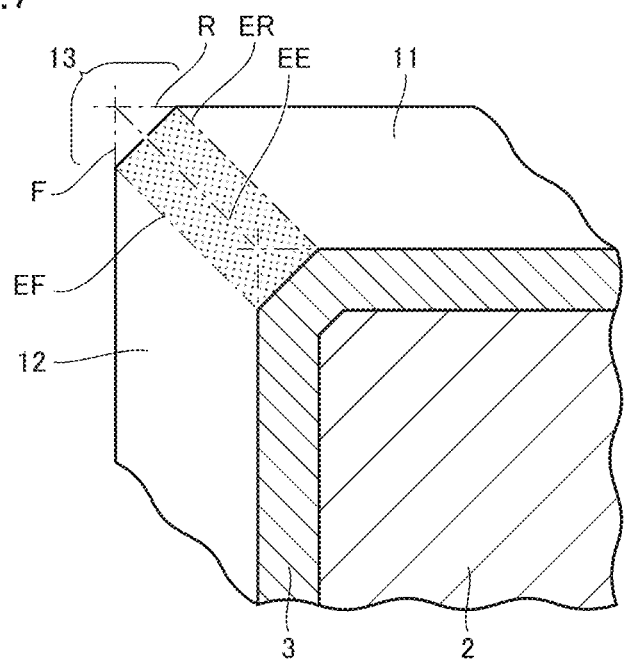
FIG. 7 is a sectional perspective view of the sectional perspective view illustrated in FIG. 3 in a case where a cutting edge is negative-land-processed.

FIG. 6 and FIG. 7 illustrate negative-land-processed cutting tool 1 that has a negative-land shape. FIG. 6 and FIG. 7 also illustrate, in addition to each of the parts of cutting tool 1, imaginary plane R that includes rake face 11, imaginary plane F that includes flank face 12, imaginary ridgeline EE formed by crossing imaginary plane R and imaginary plane F, imaginary boundary line ER to be a boundary of deviation between rake face 11 and imaginary plane R, and imaginary boundary line EF to be a boundary of deviation between flank face 12 and imaginary plane F. In cutting tool 1 that has a negative-land shape, "ridgeline E" is also replaced for "imaginary ridgeline EE".

In cutting tool 1 that has such a negative-land shape, "the part proximity to imaginary ridgeline EE in rake face 11 and flank face 12" is defined as a region sandwiched by imaginary boundary line ER and imaginary boundary line EF (the dot-hatched region in FIG. 7). Therefore, the region of cutting edge 13 in cutting tool 1 that has a negative-land shape is a part corresponding to the dot-hatched region in FIG. 7.

Figure 8:
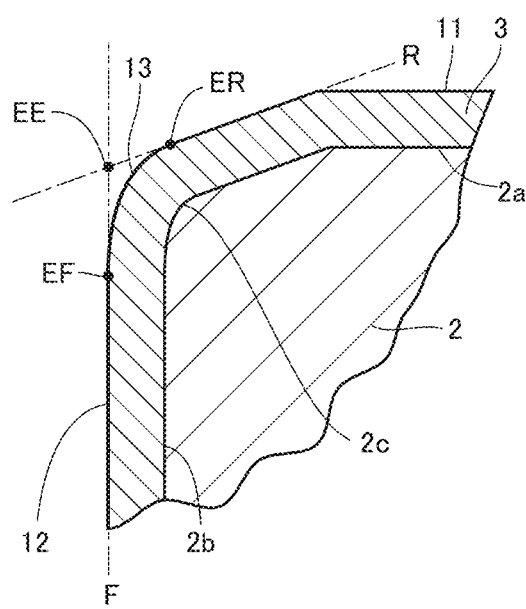
FIG. 8 is a partial view of the sectional view illustrated in FIG. 2 in a case where a cutting edge is hone-processed and negative-land-processed.
Figure 9:
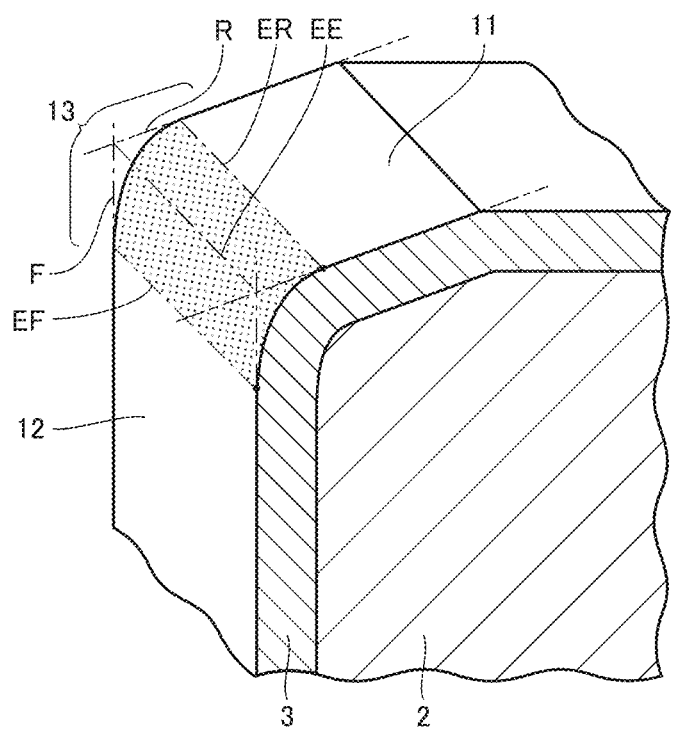
FIG. 9 is a sectional perspective view of the sectional perspective view illustrated in FIG. 3 in a case where a cutting edge is hone-processed and negative-land-processed.
Figure 10:
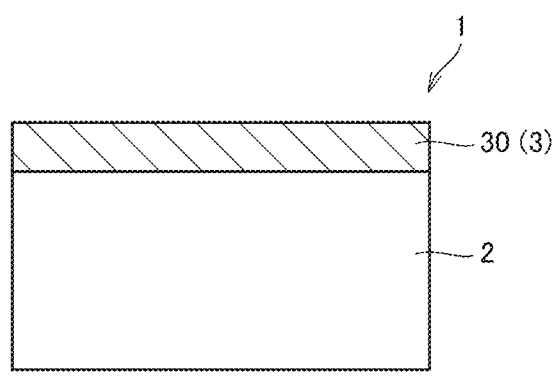
FIG. 10 is a schematically sectional view illustrating an example of a coating film of a cutting tool according to an embodiment of the present disclosure.

FIG. 8 and FIG. 9 illustrate cutting tool 1 that has combination of a honed shape and a negative-land-processed shape. FIG. 8 and FIG. 9 also illustrate, in addition to each of the parts of cutting tool 1, imaginary plane R that includes rake face 11, imaginary plane F that includes flank face 12, imaginary ridgeline EE formed by crossing imaginary plane R and imaginary plane F, imaginary boundary line ER to be a boundary of deviation between rake face 11 and imaginary plane R, and imaginary boundary line EF to be a boundary of deviation between flank face 12 and imaginary plane F. In cutting tool 1 that has combination of a honed shape and a negative-land-processed shape, "ridgeline E" is also replaced for "imaginary ridgeline EE". Imaginary plane R is a plane that includes a plane near the region of cutting edge 13 in rake face 11.

In cutting tool 1 that has such a shape, "the part proximity to imaginary ridgeline EE in rake face 11 and flank face 12" is defined as a region sandwiched by imaginary boundary line ER and imaginary boundary line EF (the dot-hatched region in FIG. 8). Therefore, the region of cutting edge 13 in cutting tool 1 is a part corresponding to the dot-hatched region in FIG. 9.

FIG. 1 illustrates cutting tool 1 as an indexable cutting insert for turning. However, cutting tool 1 is not limited thereto, and examples thereof include a drill, an endmill, an indexable cutting insert for a drill, an indexable cutting insert for an endmill, an indexable cutting insert for milling, a metal saw, a gear-cutting tool, a reamer, and a tap.

When cutting tool 1 is an indexable cutting insert and the like, cutting tool 1 includes one that has a chip breaker and one that has no chip breaker. The region of cutting edge 13 can include any of: the sharp-edge shape (ridge with crossing rake face 11 and flank face 12) (see FIG. 1 to FIG. 3); the hone-processed shape (rounded sharp edge) (see FIG. 4 and FIG. 5); the negative-land-processed (chamfered) shape (see FIG. 6 and FIG. 7); and the honing-processed and negative-land-processed shape in combination (see FIG. 8 and FIG. 9).

As illustrated in FIG. 2, cutting tool 1 comprises a substrate 2 and a coating film 3 dispersed on substrate 2. Coating film 3 may be provided on a part of the surface of substrate 2, or may be provided on the entirety thereof. Note that coating film 3 is provided in at least a region within a distance (linear distance) D from ridgeline E or imaginary ridgeline EE of 300 μm or less in the surface of substrate 2. As long as the effect of the present disclosure is exhibited, coating film 3 that has partially difference constitution does not depart from the scope of the present embodiment.

As substrate 2, any substrates conventionally known as this kind of substrate can be used. For example, any of cemented carbide (such as WC-based cemented carbide, cemented carbide that contains WC and Co, and cemented carbide in which a carbonitride of Ti, Ta, Nb, or the like is further added), cermet (cermet that mainly contains TiC, TiN, TiCN, and the like), high-speed steel, ceramics (such as titanium carbide, silicon carbide, silicon nitride, aluminum nitride, and aluminum oxide), a cubic boron nitride sintered material, or a diamond sintered material is preferable. Among these substrates 2, WC-based cemented carbide and cermet (particularly TiCN-based cermet) are particularly preferably selected. This is because these substrates 2 have particularly excellent balance between hardness and strength at high temperature, and have excellent characteristics as substrate 2 of cutting tool 1.

<Coating Film>

Figure 20:
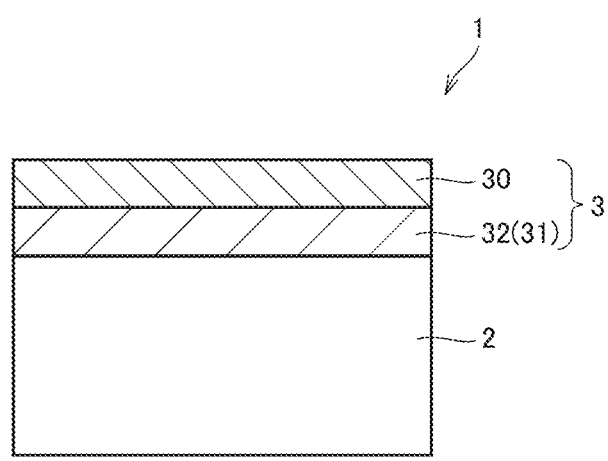
FIG. 20 is a schematically sectional view illustrating another example of a coating film of a cutting tool according to an embodiment of the present disclosure.
Figure 21:
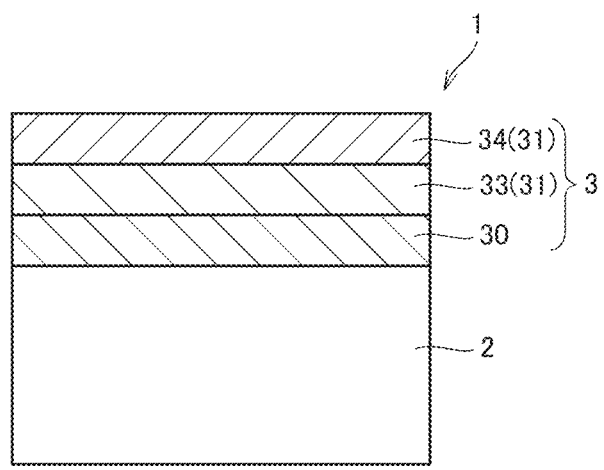
FIG. 21 is a schematically sectional view illustrating still another example of a coating film of a cutting tool according to an embodiment of the present disclosure.

Coating film 3 of Embodiment 1 includes TiSiCN layer 30. Coating film 3 of the present embodiment may or may not include another layer 31 as long as TiSiCN layer 30 is included. Examples of another layer 31 include a base layer, an intermediate layer, and a surface layer. The base layer can be provided between the substrate and the TiSiCN layer (FIG. 20). Examples of the base layer include a TiN layer, a TiC layer, a TiCN layer, a TiBN layer, or an $Al_2O_3$ layer. The intermediate layer can be provided between the base layer and the TiSiCN layer (not illustrated) or between the TiSiCN layer and the surface layer (FIG. 21). Examples of the intermediate layer include a TiCN layer or a TiCNO layer. The surface layer can be provided on the outermost surface of the coating film (FIG. 21). Examples of the surface layer include a TiC layer, a TiCN layer, a TiN layer, or an $Al_2O_3$ layer.

A thickness of coating film 3 is preferably 2.0 μm or more and 20.0 μm or less. If the thickness of coating film 3 is less than 2.0 μm, the tool lifetime tends to be insufficient. If the thickness of coating film 3 is more than 20.0 μm, stress is generated in the coating film during the process, and peeling or breakage is likely to occur. The thickness of coating film 3 is more preferably 3.0 μm or more and 19.0 μm or less, and further preferably 4.0 μm or more and 18 μm or less. A method for measuring the thickness of the coating film will be described later.

<TiSiCN Layer>

TiSiCN layer 30 of the present embodiment has a first TiSiCN layer positioned in rake face 11 and a second TiSiCN layer positioned in the region of cutting edge 13.

That is, there are a region composed of the first TiSiCN layer and a region composed of the second TiSiCN layer in one TiSiCN layer 30.

(Composition of TiSiCN Layer)

The composition of the first TiSiCN layer is $Ti_{(1-Xr)}Si_{Xr}CN$, and the composition of the second TiSiCN layer is $Ti_{(1-Xe)}Si_{Xe}CN$. Here, the Xr and the Xe each represent 0.010 or more and 0.100 or less, and satisfy a relationship of Xr−Xe≥0.003. According to this, excellent "wearing resistance" and excellent "breakage resistance" can be imparted to the cutting tool.

A lower limit of the Xr is preferably 0.013 or more, more preferably 0.017 or more, and further preferably 0.020 or more, from the viewpoint of improvement of the wearing resistance of rake face 11. An upper limit of the Xr is preferably 0.100 or less, more preferably 0.090 or less, and further preferably 0.080 or less, from the viewpoint of inhibition of deterioration in toughness (breakage resistance) of rake face 11 with the improvement of the wearing resistance of rake face 11. The Xr is preferably 0.013 or more and 0.100 or less, preferably 0.017 or more and 0.090 or less, and further preferably 0.020 or more and 0.080 or less.

A lower limit of the Xe is preferably 0.010 or more, more preferably 0.015 or more, and further preferably 0.020 or more, from the viewpoint of improvement of the wearing resistance of the region of cutting edge 13. An upper limit of the Xe is preferably 0.097 or less, more preferably 0.090 or less, and further preferably 0.080 or less, from the viewpoint of inhibition of deterioration in toughness (breakage resistance) of the region of cutting edge 13 with the improvement of the wearing resistance of the region of cutting edge 13. The Xe is preferably 0.010 or more and 0.097 or less, preferably 0.015 or more and 0.090 or less, and further preferably 0.020 or more and 0.080 or less.

A lower limit of "Xr−Xe" is preferably 0.003 or more, more preferably 0.008 or more, and further preferably 0.015 or more, particularly from the viewpoint of improvement of the wearing resistance of rake face 11 and particularly improvement of the breakage resistance of the region of cutting edge 13. An upper limit of "Xr−Xe" is preferably 0.100 or less, more preferably 0.090 or less, and further preferably 0.080 or less, from the viewpoint of inhibition of deterioration in toughness due to occurrence of stress concentration in the film caused by too high concentration gradient. "Xr−Xe" is preferably 0.003 or more and 0.100 or less, more preferably 0.008 or more and 0.090 or less, and further preferably 0.015 or more and 0.080 or less.

The Xr and the Xe can be determined by point analysis using a scanning electron microscope equipped with energy dispersive X-ray spectrometer (SEM-EDS).

The specific method will be described below.

(A1) Cutting tool 1 is cut so that a cross section along the thickness direction of coating film 3 is exposed to obtain a measurement specimen. The cutting position is preferably decided with considering an actual using situation of the cutting tool.

Figure 11:
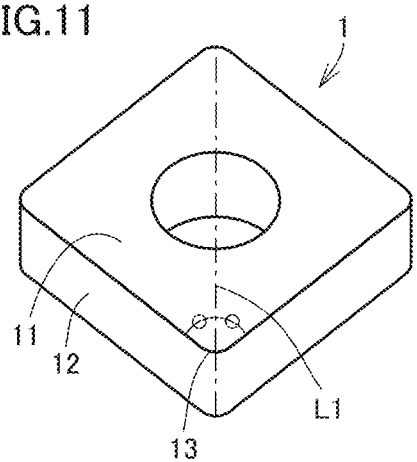
FIG. 11 is a view for describing a cutting position of a cutting tool.
Figure 12:
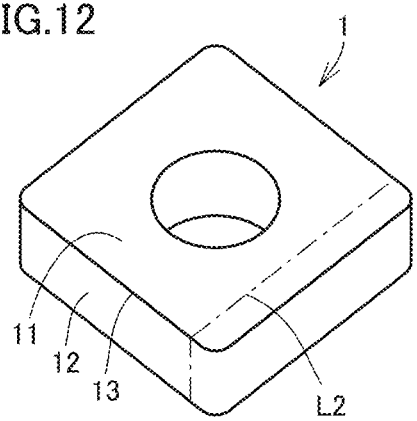
FIG. 12 is another view for describing a cutting position of a cutting tool.

FIG. 11 and FIG. 12 are views for describing the cutting position of cutting tool 1. When cutting tool 1 is used for cutting a workpiece with cutting edge 13 of the corner part (part of the apex angle that draws an arc), cutting tool 1 is cut so that the cutting position includes a line L1 that bisects the corner part and so that the cross section along the thickness direction of coating film 3 is exposed, as illustrated in FIG. 11. Meanwhile, when cutting tool 1 is used for cutting a workpiece with cutting edge 13 of a straight part (part that draws a straight line), cutting tool 1 is cut so that the cutting position includes a line L2 perpendicular to cutting edge 13 of the straight part and so that the cross section along the thickness direction of coating film 3 is exposed, as illustrated in FIG. 12. As necessary, the exposed sectional face is polish-treated to smooth the cutting face.

(B1) The cutting face is observed by using the SEM-EDS with 5000 times magnification, and set are three measurement fields that have rectangular shapes with 1 μm or more in the thickness direction of coating film 3×5 μm or more in the direction perpendicular to the thickness direction so as to include the first TiSiCN layer positioned in rake face 11 or the second TiSiCN layer positioned in the region of cutting edge 13. A thickness direction of the measurement field is set so as to entirely include the thickness of the first TiSiCN layer or the thickness of the second TiSiCN layer.

When the measurement field is set so as to include the first TiSiCN layer positioned in rake face 11, the measurement field is set so as to include the first TiSiCN layer on a side of rake face 11 with a distance from ridgeline E or imaginary ridgeline EE of 200 μm or more and 500 μm or less. When the measurement field is set so as to include the second TiSiCN layer position in the region of cutting edge 13, the measurement field is set so as to include the second TiSiCN layer on a side of the region of cutting edge 13 with a distance from ridgeline E or imaginary ridgeline EE of 200 μm or more and 500 μm or less.

Figure 13:
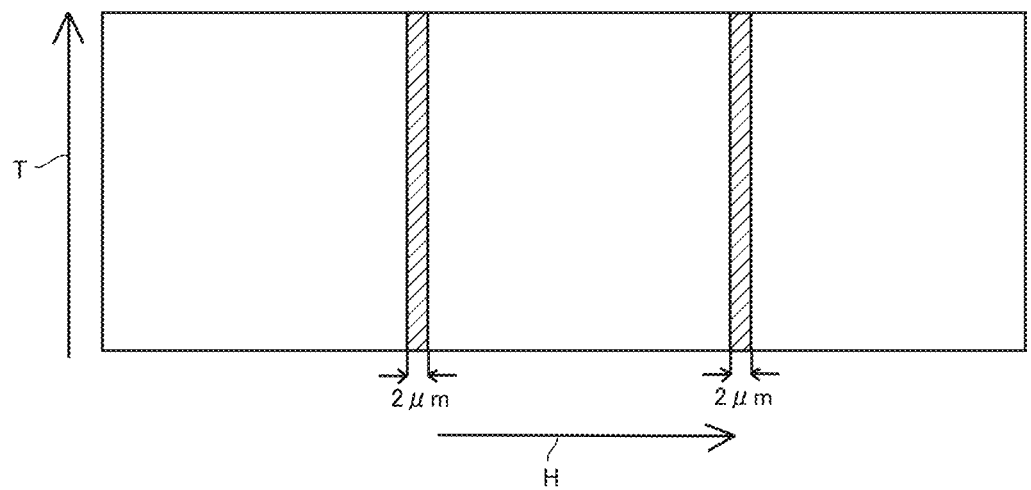
FIG. 13 is a view for describing a method for setting a measurement field in measuring a composition of a TiSiCN layer.

As illustrated in FIG. 13, the above three measurement fields are set so that sides of the thickness direction of each measurement field (direction illustrated by the arrow T in FIG. 13) are contacted with each other to continue for each measurement field. A part of each measurement field may be overlapped (the overlapped part is illustrated with slanted lines in FIG. 13). In this case, the measurement field is set so that a length of the overlapped part of sides in the direction perpendicular to the thickness direction of each measurement field (direction illustrated by the arrow H in FIG. 13) is 2 μm or less.

(C1) First, in each of the above three measurement fields, the region of the first TiSiCN layer is specified. Specifically, elemental mapping by SEM-EDS is performed in each measurement field to specify a layer that contains Ti and Si. The specified layer corresponds to the first TiSiCN layer. Then, each of the above three measurement fields is observed with 5000 times magnification, and a composition ratio of Ti and Si in the first TiSiCN layer is analyzed to calculate Xr, which is the proportion of Si to the total number of atoms of Ti and Si. An average value of Xr of the three measurement fields corresponds to Xr in $Ti_{(1-Xr)}Si_{Xr}CN$, the composition of the first TiSiCN layer of the present embodiment.

Xe in $Ti_{(1-Xe)}Si_{Xe}CN$, the composition of the second TiSiCN layer positioned in the cutting edge region is also measured by the same method as of the Xr except that the positions of the measurement fields are set in the second TiSiCN layer positioned in the region of cutting edge 13. The measurement fields are set in the second TiSiCN layer with a distance from ridgeline E or imaginary ridgeline EE of 20 μm or less.

The SEM-EDS analysis is performed by using, for example, a scanning electron microscope (S-3400N model, manufactured by Hitachi High-Tech Corporation), and the measurement can be performed under the following conditions.

Acceleration voltage: 15 kV
Process time: 5
Spectrum range: 0 to 20 keV
Number of channels: 1 K
Number of frames: 150
X-ray extraction angle: 30°

It has been confirmed that, as long as the measurement is performed with the same cutting tool, the measurement results have no variation even with randomly selecting the measurement portion.

In the $Ti_{(1-Xr)}Si_{Xr}CN$, a ratio A:B between A, which is a total of a number of Ti atoms and a number of Si atoms, and B, which is a total of a number of C atoms and a number of N atoms, is not limited to 1:1, and may be other than 1:1 as long as the effect of the present disclosure is not impaired. The ratio can be, for example, A:B=1:0.8 to 1.1. The B can be determined by the same method as of Xr except that, in the (C1), "a composition ratio of Ti, Si, C, and N in the first TiSiCN layer is analyzed to calculate a rate of the total number of atoms of C and N to the total number of atoms of Ti, Si, C, and N. The number of C atoms and the number of N atoms can be determined by measurement using TEM-EDS. An average value of the rates of the three measurement fields corresponds to the B in $Ti_{(1-Xr)}Si_{Xr}CN$, the composition of the first TiSiCN layer of the present embodiment."

In the $Ti_{(1-Xe)}Si_{Xe}CN$, a ratio A:B between A, which is a total of a number of Ti atoms and a number of Si atoms, and B, which is a total of a number of C atoms and a number of N atoms, is not limited to 1:1, and may be other than 1:1 as long as the effect of the present disclosure is not impaired. The ratio can be, for example, A:B=1:0.8 to 1.1. The B can be determined by the same method as the measurement method of B in the first TiSiCN layer except that "the second TiSiCN layer" is analyzed.

(Thickness of TiSiCN Layer)

In the present embodiment, the thickness of TiSiCN layer 30 is preferably 2.0 μm or more and 15 μm or less. If the thickness of TiSiCN layer 30 is less than 2.0 μm, the effect of improving the wearing resistance and the breakage resistance with TiSiCN layer 30 is hardly obtained to tend to cause insufficient tool lifetime. If the thickness of TiSiCN layer 30 is more than 15 μm, stress is generated in TiSiCN layer 30 during the process, and peeling or breakage is likely to occur. The thickness of TiSiCN layer 30 is more preferably 3.0 μm or more and 14 μm or less, and further preferably 4.0 μm or more and 13 μm or less. A method for measuring the thickness of TiSiCN layer 30 is as follows.

(A2) By the same method as the method described in (A1) of the method for measuring the composition of TiSiCN layer 30, cutting tool 1 is cut so that the cross section along the thickness direction of coating film 3 is exposed to obtain a specimen.

(B2) The above cross section is observed by using a scanning electron microscope (S-3400N model, manufactured by Hitachi High-Tech Corporation) with 5000 times magnification, and a thickness of TiSiCN layer 30 is measured at random six positions along a normal line of the surface of substrate 2. Of the random six positions, three positions are positioned in the first TiSiCN layer, and the other three positions are positioned in the second TiSiCN layer. An arithmetic average thereof corresponds to "thickness of TiSiCN layer 30". A measurement condition of the SEM is same as the measurement condition described in (C1) of the method for measuring the composition of the first TiSiCN layer.

It has been confirmed that, as long as the measurement is performed with the same cutting tool 1, the measurement results have no variation even with randomly selecting the measurement portion.

In the present embodiment, a thickness of coating film 3 and a thickness of another layer 31 are also measured in the same manner as above. Also, of these thicknesses, it has been confirmed that, as long as the measurement is performed with the same cutting tool 1, the measurement results have no variation even with randomly selecting the measurement portion.

(Structure of TiSiCN Layer)

It is preferable that TiSiCN layer 30 be composed of a plurality of hard particles, and the hard particles have a lamellar structure in which a layer with a relatively high silicon concentration and a layer with a relatively low silicon concentration are alternately stacked. According to this, if distortion occurs in the hard particles to generate cracking on the surface of coating film 3 with cutting, expansion of the cracking into substrate 2 is effectively inhibited. In addition, the hard particles and TiSiCN layer 30 become hard, and the wearing resistance of cutting tool 1 is improved. Thus, cutting tool 1 can have a longer tool lifetime, in particular, in intermittent turning of steel. In cutting tool 1, "TiSiCN layer 30 being composed of a plurality of hard particles, and the hard particles having a lamellar structure in which a layer with a relatively high silicon concentration and a layer with a relatively low silicon concentration are alternately stacked" is confirmed by the following methods (A3) to (F3).

(A3) Cutting tool 1 is cut along the normal line of the surface of coating film 3 with a diamond wire to expose a cross section of TiSiCN layer 30. The exposed cross section is subjected to focused ion-beam process (hereinafter, also referred to as "FIB process") to allow the cross section to be a mirror state.

Figure 19:
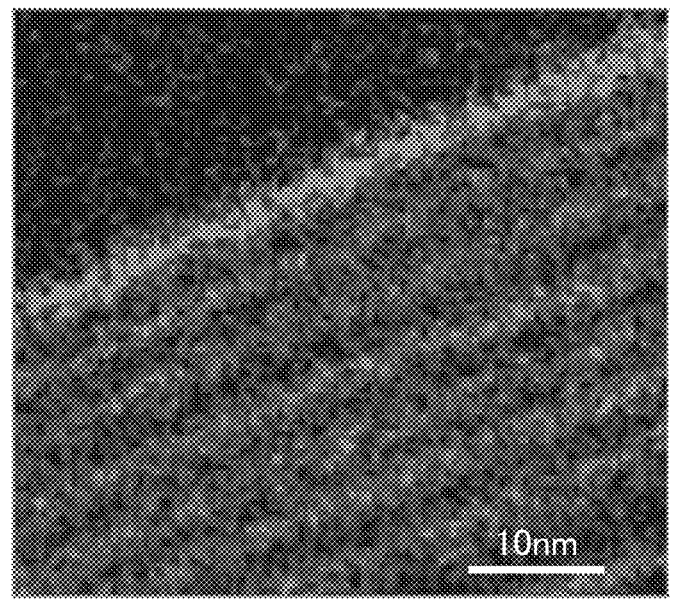
FIG. 19 is a view illustrating an example of an image of a cross section of a TiSiCN layer of a cutting tool according to Embodiment 1 with high-angle annular dark-field scanning transmission electron microscopy (HAADF-STEM).

(B3) The FIB-processed cross section is observed by using a high-angle annular dark-field scanning transmission electron microscopy (HAADF-STEM) to specify one hard particle. The magnification time is 2,000,000. Then, a HAADF-STEM image of the specified one hard particle is obtained. FIG. 19 is an image showing an example of the HAADF-STEM image of the one hard particle of cutting tool 1 of the present embodiment. In FIG. 19, a layer shown in black is the region with a relatively low silicon concentration (silicon low-concentration layer), and a layer shown in white or gray is the region with a relatively high silicon concentration (silicon high-concentration layer).

(C3) In the HAADF-STEM image, a measurement region (size: 50 nm×50 nm) is set so as to include a region in which seven or more layers of each of the silicon low-concentration layer shown in black and the silicon high-concentration layer shown in white or gray are stacked.

(D3) In the measurement region in the HAADF-STEM image, a stacking direction of the silicon high-concentration layers and the silicon low-concentration layers is specified. Specifically, an electron beam diffraction pattern in the restricted field region and the stacking direction of the silicon high-concentration layers and the silicon low-concentration layers are overlapped, and the stacking direction is specified with the direction indicated by the diffraction spot.

(E3) In the measurement region in the HAADF-STEM image, line analysis is performed along the stacking direction with EDX equipped with STEM to measure the composition. A beam diameter of the line analysis is 0.5 nm or less, a scanning interval is 0.5 nm, and a length of the line analysis is 50 nm.

(F3) When the result of the line analysis satisfies the following (a1) to (b1), it is confirmed that the hard particles have the lamellar structure in which the layer with a relatively high silicon concentration and the layer with a relatively low silicon concentration are alternately stacked.

(a1) The measurement region contains titanium (Ti), silicon (Si), carbon (C), and nitrogen (N).

(b1) With the result of the line analysis, a graph is prepared. The graph has coordinates of the X axis that indicates a distance from a beginning point of the measurement and the Y axis that indicates a percentage of the number of silicon atoms $X_{Si}$ to the total of the number of silicon atoms $X_{Si}$ and the number of titanium atoms, $X_{Ti}$ $\{X_{Si}/(X_{Si}+X_{Ti})\}\times 100$. In the graph, an average of the percentages $\{X_{Si}/(X_{Si}+X_{Ti})\}\times 100$ (hereinafter, also referred to as "the average") in the measurement region is calculated. With increasing the distance from the beginning point of the measurement, a region with a higher percentage $\{X_{Si}/(X_{Si}+X_{Ti})\}\times 100$ than the average and a region with a lower percentage are alternately present. The region with a higher percentage $\{X_{Si}/(X_{Si}+X_{Ti})\}\times 100$ than the average corresponds to the layer with a relatively high silicon concentration. The region with a lower percentage $\{X_{Si}/(X_{Si}+X_{Ti})\}\times 100$ than the average corresponds to the layer with a relatively low silicon concentration.

It has been confirmed that, as long as the measurement is performed on the same specimen, the measurement results have almost no variation even when the measurement is performed a plurality of times with changing the hard particle specified in the (B3), and that the result is not willful even with randomly setting the measurement portion.

(Average of Periodic Widths of Lamellar Structure)

An average of periodic widths of the lamellar structure is preferably 3 nm or more and 20 nm or less. According to this, the distortion between the silicon high-concentration layer and the silicon low-concentration layer can be maintained to improve the breakage resistance, and cutting tool 1 can have a longer tool lifetime in the intermittent turning of steel in particular. Here, the periodic width of the lamellar structure is referred to a distance from one silicon high-concentration layer to another silicon high-concentration layer adjacent to the one silicon high-concentration layer across the adjacent silicon low-concentration layer. This distance is referred to a distance between the middle points in the thickness direction of each layer of the silicon high-concentration layer and the other silicon high-concentration layer. The average of the periodic widths of the lamellar structure means an average of periodic widths of all the lamellar structures measured in the measurement region set in the above (C3).

A method for measuring the periodic width of the silicon concentration herein is as follows. The measurement region is set by the same method as the above (A3) to (C3). The measurement region is subjected to a Fourier transformation to obtain a Fourier-transformed image (not illustrated). In the Fourier-transformed image, the periodicity in the measurement region appears as a spot. The periodic width is calculated by calculating a reciprocal of a distance between the above spot and an image center that indicates the maximum intensity in the Fourier-transformed image.

It has been confirmed that, as long as the measurement is performed on the same specimen, the measurement results have almost no variation even when the measurement is performed a plurality of times with changing the measurement position, and that the result is not willful even with randomly setting the measurement portion.

A number of staking of the silicon high-concentration layer and the silicon low-concentration layer that constitute the lamellar structure (total number of stacking) is not particularly limited, and is preferably, for example, 10 or more and 1000 or less. When the number of stackings is 10 or more, coarsening of crystal grains in each silicon high-concentration layer and each silicon low-concentration layer is inhibited, and the hardness of the hard particle can be maintained. When the number of stackings is 1000 or less, the thickness of each silicon high-concentration layer and each silicon low-concentration layer can be sufficiently maintained, and mixing of unit layers can be inhibited.

TiSiCN layer 30 preferably has a pillar structure. Here, "TiSiCN layer 30 has a pillar structure" means "an average aspect ratio of the hard particles is 3 or more". According to this, TiSiCN layer 30 can exhibit high strength against stress into the shearing direction, and a micro cracking is inhibited to improve the wearing resistance. Thus, the cutting tool can have a longer tool lifetime, in particular, in intermittent turning of steel. Note that the average aspect ratio of the hard particles is measured by the following procedures (A4) to (D4).

(A4) Cutting tool 1 is cut along the normal line of the surface of coating film 3 with a diamond wire to expose a cross section of TiSiCN layer 30. The exposed cross section is subjected to focused ion-beam process (hereinafter, also referred to as "FIB process") to allow the cross section to be a mirror state.

(B4) On the FIB-processed cross section, a rectangular observation field is set. A pair of sides of the observation field is set to have a length of 30 µm in a direction parallel to the surface of substrate 2, and the other pair of sides is set to have a length that includes the entirety of TiSiCN layer 30 in the normal line direction to the surface of substrate 2 (thickness of TiSiCN layer 30).

(C4) Using a high-resolution electron backscatter diffraction apparatus, the observation field is analyzed with an interval of 0.02 µm to determine measurement points that have a cubic crystalline structure (hereinafter, also referred to as "cubic structure") in the observation field. Among the measurement points, a gap between a measurement point A that has the cubic structure and a measurement point B adjacent to the measurement point A is defined as the particle boundary when the gap between the measurement point A and the measurement point B has a direction difference of 5° or more. When there is no measurement point that has a cubic structure adjacent to the measurement point A, an outer circumference of the measurement point A is defined as the particle boundary.

A particle that includes a measurement point that has a cubic structure in a region surrounded by the particle boundary is defined as one crystal grain. When a specific measurement point has a direction difference of 5 or more from all the adjacent measurement points or when the measurement point has no cubic structure and is present alone, such a measurement point is not judged as a crystal grain. That is, a particle in which two or more measurement points are connected is treated as a crystal grain. According to this, the particle boundary is judged to specify the crystal grain.

(D4) Then, image processing is performed to determine a maximum length H in the normal line direction to the surface of substrate 2; a maximum length W in a direction parallel to the surface of substrate 2: and an area S, of each crystal grain (each hard particle). An aspect ratio A of the crystal grain (hard particle) is calculated as A=H/W. In the observation field, 20 crystal grains (hard particles) P1 to P20 are randomly selected. On each of the 20 crystal grains (hard particles), aspect ratios are determined. An area-weighted average $A_{ave}$ of the aspect ratios A of the 20 crystal grains (hard particles) P1 to P20 is calculated based on the expression "$A_{ave}$=(A1S1+A2S2+ . . . +A20S20)/(S1+S2+ . . . +Sn)". In the expression, A1 to A20 each represent the aspect ratios A of the crystal grains (hard particles) P1 to P20. In the expression, S1 to S20 each represent the areas S of the crystal grains (hard particles) P1 to P20.

The obtained area-weighted average $A_{ave}$ herein corresponds to the average aspect ratio of the hard particles. It has been confirmed that, as long as the measurement is performed on the same specimen, the measurement results have almost no variation even when the measurement is performed a plurality of times with changing the observation field, and that the result is not willful even with randomly setting the observation field.

(Crystalline Structure of TiSiCN Layer)

TiSiCN layer 30 preferably has 90 vol % or more of the cubic crystalline structure. According to this, TiSiCN layer 30 can have higher hardness, and thereby cutting tool 1 can have more excellent wearing resistance. TiSiCN layer 30 more preferably has 92 vol % or more, further preferably 94 vol % or more, of the cubic crystalline structure. Although TiSiCN layer 30 most preferably has 100 vol % of the cubic crystalline structure, TiSiCN layer 30 can have 98 vol % or less, 96 vol % or less, or 95 vol % or less, thereof from the viewpoint of manufacturing. TiSiCN layer 30 preferably has 90 vol % or more and 100 vol % or less, more preferably 92 vol % or more and 98 vol % or less, and further preferably 94 vol % or more and 96 vol % or less, of the cubic crystalline structure. The proportion (percentage) of the cubic crystalline structure in TiSiCN layer 30 can be determined with formulation observation by using an electron backscattering diffraction apparatus. Specifically, the above (A4) to (C4) are firstly performed to specify a measurement point. Note that, in a direction mapping image (color map), a cubic crystalline part is indicated in "color other than black", and a part other than the cubic crystalline part is indicated in "black". In the direction mapping image, an area proportion of the part in "color other than black" can be calculated to determine the proportion (percentage) of the cubic crystalline structure in TiSiCN layer 30.

Embodiment 2: Method for Manufacturing Cutting Tool

Using FIGS. 14 to 18, a method for manufacturing a cutting tool of the present embodiment will be described. The method for manufacturing a cutting tool of the present embodiment is a method for manufacturing the cutting tool described in Embodiment 1, the method comprising:
 a first step of preparing a substrate; and
 a second step of forming a coating film on the substrate, wherein
 the second step includes a step 2a of forming the above TiSiCN layer by a CVD method using a CVD apparatus.

<<First Step>>

In the first step, a substrate is prepared. For example, when cemented carbide is used as the substrate, a commercially available substrate may be used, or the substrate may be manufactured by common powder metallurgy. When the substrate is manufactured by common powder metallurgy, for example, a WC powder, a Co powder, and the like are mixed with a ball mill and the like to obtain a mixed powder.

After the mixed powder is dried, the dried mixed powder is molded into a predetermined shape to obtain a molded product. Furthermore, the molded product is sintered to obtain WC—Co-based cemented carbide (sintered material). Then, the sintered material can be subjected to a predetermined cutting-edge process, such as horning process, to manufacture a substrate composed of the WC—Co-based cemented carbide. Any substrate other than the above can be prepared as long as the substrate is conventionally known as this kind of substrate.

<<Second Step>>

Next, in the second step, a coating film is formed on the substrate. The coating film is formed by using a CVD apparatus illustrated in FIG. 14, for example. In a CVD apparatus 50, a plurality of substrate-setting tools 52 that hold substrates 10 can be disposed, and these are covered by a reaction chamber 53 made of heat-resistant alloy steel. Around reaction chamber 53, a temperature controller 54 is disposed, and a temperature in reaction chamber 53 can be controlled with this temperature controller 54.

On CVD apparatus 50, a nozzle 56 that has two inlets 55 and 57 are disposed. Nozzle 56 can have still another inlet (not illustrated). Nozzle 56 is disposed so as to penetrate a region where substrate-setting tools 52 are disposed. In a part of nozzle 56 near substrate-setting tool 52, a plurality of jetting ports (a first jetting port 61, a second jetting port 62, and a third jetting port (not illustrated)) are formed.

Figure 14:
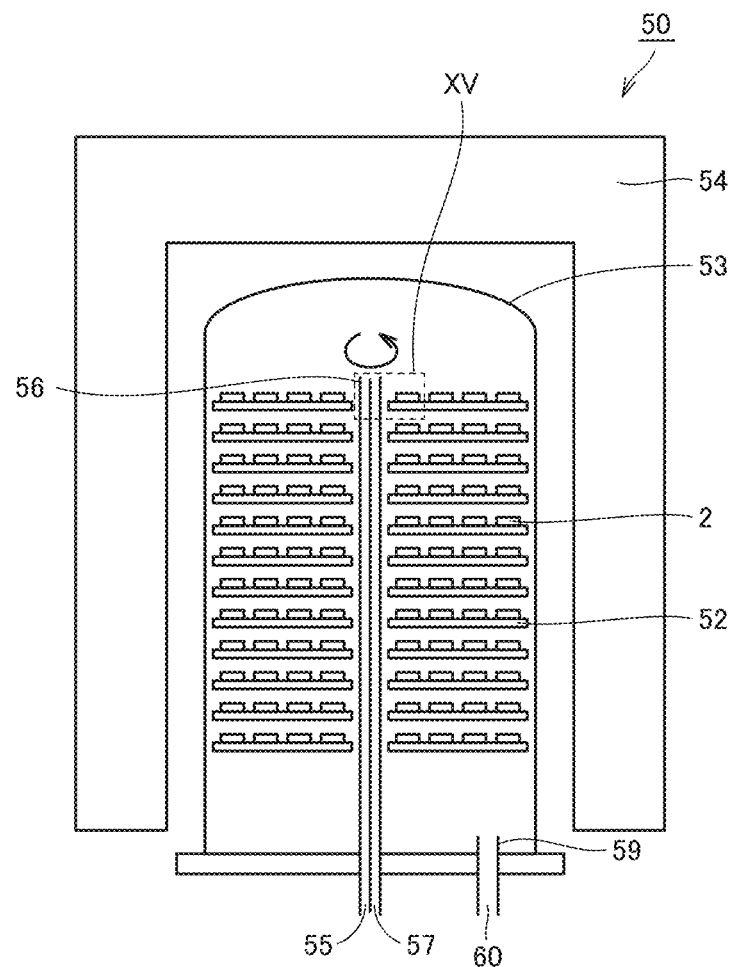
FIG. 14 is a schematically sectional view of an example of a CVD apparatus used for a method for manufacturing a cutting tool according to Embodiment 2.

In FIG. 14, each gas introduced through inlets 55, 57 and the other inlet (not illustrated) into nozzle 56 is not mixed with each other in nozzle 56 to be introduced into reaction chamber 53 through jetting ports different from each other. This nozzle 56 can rotate with its axis as a central axis. On CVD apparatus 50, an exhaust pipe 59 is disposed, and exhaust gas can be discharged outward through an exhaust port 60 of exhaust pipe 59. Tools and the like inside reaction chamber 53 are typically constituted with graphite.

<Step 2a>

In the step 2a, the TiSiCN layer is formed by a CVD method using the CVD apparatus. The step 2a includes a step 2a-1 of jetting $TiCl_4$ gas, $SiCl_4$ gas, and $CH_3CN$ gas toward the surface of the substrate. The $TiCl_4$ gas is jetted through a plurality of the second jetting ports provided on the nozzle of the CVD apparatus, and the $SiCl_4$ gas is jetted through a plurality of the first jetting ports provided on the nozzle. The $CH_3CN$ gas is jetted through a plurality of third jetting ports 63 (FIG. 18) provided on the nozzle when nozzle 56 has still another inlet (not illustrated). When nozzle 56 does not have still another inlet port (not illustrated), the $CH_3CN$ gas is jetted through the plurality of the first jetting ports and the plurality of the second jetting ports. In the step 2a-1, the nozzle rotates.

In this step, a substrate temperature in the reaction chamber is preferably within a range of 800 to 900° C., and a pressure in the reaction chamber is preferably 10 to 300 mbar. As a carrier gas, $H_2$ gas, $N_2$ gas, Ar gas, and the like can be used. The carrier gas is jetted through each of the first jetting port, the second jetting port, and the third jetting port.

(Condition for Regulating Xr and Xe)

Figure 15:
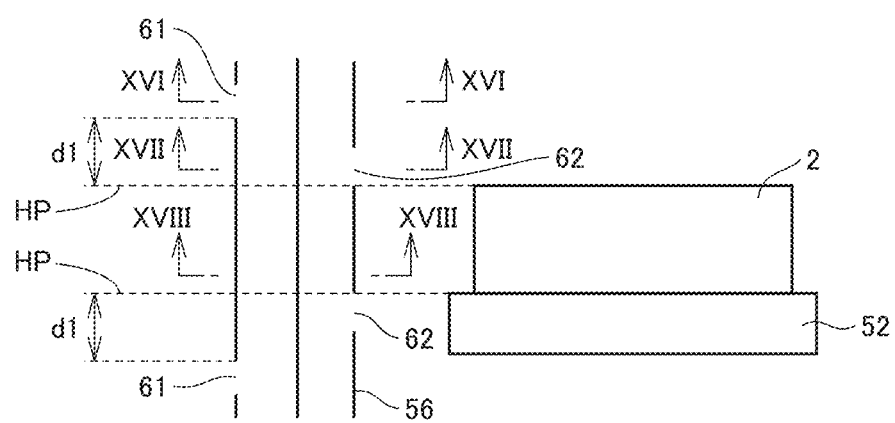
FIG. 15 is an enlarged view of the region XV in FIG. 14.
Figure 16:
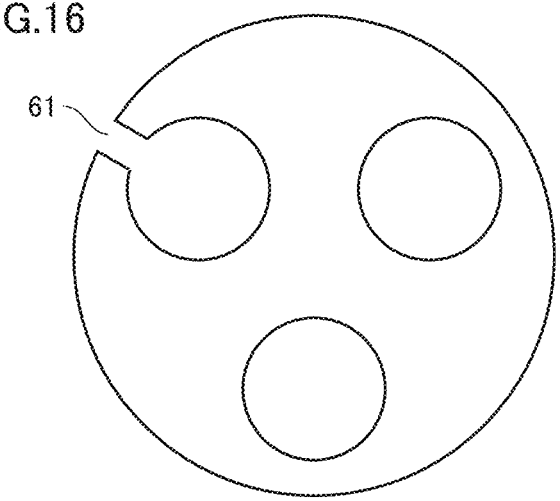
FIG. 16 is an end face view of a nozzle in FIG. 15, and is an end face view viewed from the arrow direction of the XVI-XVI line in FIG. 15.
Figure 17:
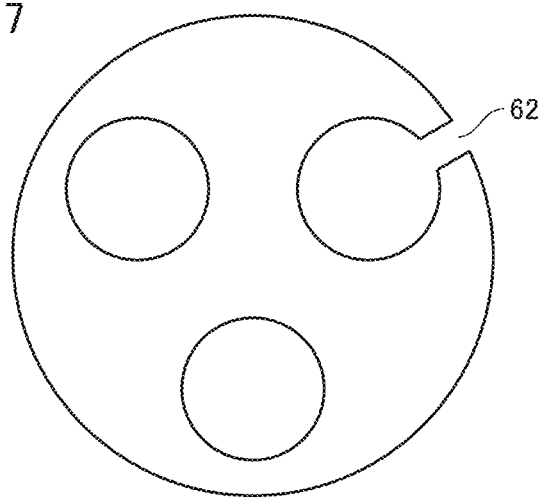
FIG. 17 is an end face view of a nozzle in FIG. 15, and is an end face view viewed from the arrow direction of the XVII-XVII line in FIG. 15.
Figure 18:
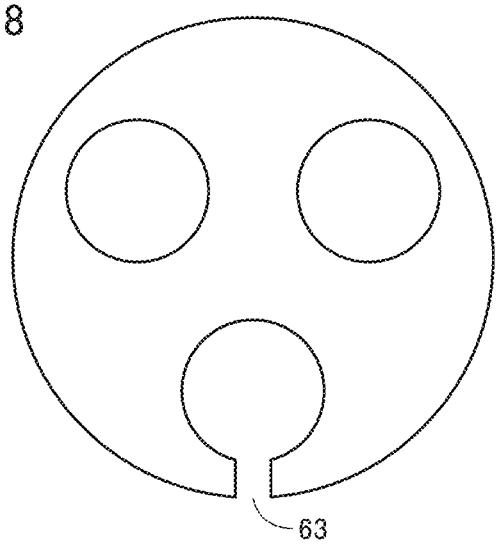
FIG. 18 is an end face view of a nozzle in FIG. 15, and is an end face view viewed from the arrow direction of the XVIII-XVIII line in FIG. 15.

Using FIG. 15 to FIG. 17, "condition for regulating Xr and Xe" will be described below. FIG. 15 is an enlarged view of the region XV in FIG. 14. FIG. 16 is an end face view of the nozzle in FIG. 15, and is an end face view viewed from the arrow direction of the XVI-XVI line in FIG. 15. FIG. 17 is an end face view of the nozzle in FIG. 15, and is an end face view viewed from the arrow direction of the XVII-XVII line in FIG. 15. In this step, first jetting port 61 is positioned with a distance from a standard height position HP, which is a height of a rake face of substrate 2 most close to the jetting port in CVD apparatus 50, to the lowest end of first jetting port 61 (in other words, a height d1 from the rake face) of 3 mm or more and 15 mm or less (FIGS. 15 and 16). In contrast, second jetting port 62 is positioned with a distance from standard height position HP, which is a height of the rake face of substrate 2 most close to the jetting port in CVD apparatus 50, to the lowest end of the second jetting port 62 (in other words, a height d2 from the rake face (not illustrated)) of 0 mm or more and 2 mm or less (FIGS. 15 and 17). According to them, since second jetting port 62 is relatively close to a cutting edge region of the substrate, the $TiCl_4$ gas jetted through second jetting port 62 is relatively easily deposited in the cutting edge region, and relatively hardly deposited on the rake face. As a result, the $SiCl_4$ gas jetted through first jetting port 61 is relatively easily deposited on the rake face. With the first jetting port, a flow rate of the $SiCl_4$ gas is set to be 1.0 ml/min or more and less than 6.0 mli/min. According to this, on the rake face in particular, excessive deposition of $SiCl_4$ can be inhibited. According to them, "the TiSiCN layer has the first TiSiCN layer positioned in the rake face and the second TiSiCN layer positioned in the cutting edge region, the composition of the first TiSiCN layer is $Ti_{(1-Xr)}Si_{Xr}CN$, the composition of the second TiSiCN layer is $Ti_{(1-Xe)}Si_{Xe}CN$, and the Xr and the Xe each represent 0.010 or more and 0.100 or less, and satisfy a relationship of Xr−Xe≥0.003." can be achieved. This is novelly found from intensive investigation by the present inventors.

(Condition for Forming Lamellar Structure)

In this step, when nozzle 56 has still another inlet (not illustrated), the composition of the gas jetted through the first jetting port can be $SiCl_4$, $H_2$, and $N_2$; the composition of the gas jetted through the second jetting port can be $TiCl_4$, $H_2$, and $N_2$; and the composition of the gas jetted through the third jetting port can be $CH_3CN$ and $H_2$. According to this, the TiSiCN layer can be composed of the plurality of the hard particles, and the hard particles can have the lamellar structure in which the layer with a relatively high silicon concentration and the layer with a relatively low silicon concentration are alternately stacked.

(Condition for Regulating Periodic Width of Lamellar Structure)

In this step, a rotation rate of the nozzle can be 1 rpm or more and 20 rpm or less. According to this, "the average of the periodic widths of the lamellar structure" can be regulated within the desired range. The rotation rate of the nozzle is preferably 1.5 rpm or more and 9.0 rpm or less According to this, "the average of the periodic widths of the lamellar structure" can be regulated within "3 nm or more and 20 nm or less".

(Condition for TiSiCN Layer to have Pillar Structure)

In this step, a film-forming temperature can be 800° C. or more and 860° C. or less. According to this, the TiSiCN layer can have the pillar structure.

(Condition for Regulating Proportion of Cubic Crystalline Structure in TiSiCN Layer)

In this step, a furnace pressure can be 10 mbar or more and 65 mbar or less.

According to this, the proportion (percentage) of the cubic crystalline structure in the TiSiCN layer can be regulated within the desired range.

(Condition for Regulating Thickness of TiSiCN Layer)

In this step, a film-forming time can be 2 hours or more and 25 hours or less. According to this, the thickness of the TiSiCN layer can be regulated within the desired range. The film-forming time is preferably 4.0 hours or more and 20.0 hours or less. According to this, the thickness of the TiSiCN layer can be regulated within 2.0 μm or more and 15 μm or less.

(Other Condition)

During the formation of the TiSiCN layer, a total gas flow rate of the reaction gases can be, for example, 120 to 200 L/min. Here, "total gas flow rate" is referred to a total volumetric amount of gases, which is considered to the ideal gas at the standard condition (0° C., 1 atm) introduced into the CVD furnace per unit time.

The coating film formed in the second step includes the TiSiCN layer. This TiSiCN layer has: the first TiSiCN layer positioned in the rake face, and the second TiSiCN layer positioned in the cutting edge region, the composition of the first TiSiCN layer is $Ti_{(1-Xr)}Si_{Xr}CN$, the composition of the second TiSiCN layer is $Ti_{(1-Xe)}Si_{Xe}CN$, and the Xr and the Xe each represent 0.010 or more and 0.100 or less, and satisfy a relationship of Xr−Xe≥0.003.

<Other Step>

In addition to the above steps, a surface treatment step such as surface polishing and shot blast can be performed.

When the coating film includes other layers (such as a base layer), these layers can be formed by a conventionally known method.

EXAMPLES

The present embodiment will be more specifically described with Examples.

However, the present embodiment is not limited by these Examples.

Example 1

<<Production of Cutting Tool>>

<First Step>

As a substrate, raw material powders composed of a cutting insert for turning made of cemented carbide Co (6 wt %)-VC (0.2 wt %)-Cr3C2 (0.4 wt %)-WC (remainder) were uniformly mixed, pressure-molded into a predetermined shape, and then sintered at 1300 to 1500° C. for 1 to 2 hours to obtain a substrate CNMG120408N-GU (manufactured by Sumitomo Electric Hardmetal Corp.).

<Other Step (Step of Forming Base Layer)>

To produce cutting tools of Samples 1-1 to 1-12, 1-12-2, and 1-101 to 1-104, a base layer (TiN layer) was formed on a surface of each substrate obtained in the above. Specifically, the substrate was set in a reaction furnace of a chemical vapor deposition apparatus to form the base layer on the substrate by the chemical vapor deposition. A condition for forming the base layer is as shown in the following Table 1.

TABLE 1

| Sample No. | Composition of reaction gas | | | Pressure in reaction chamber [mbar] | Substrate temperature [° C.] | Total gas flow rate [L/min] | Keeping time [h] |
|---|---|---|---|---|---|---|---|
| | $TiCl_4$ [vol %] | $N_2$ [vol %] | $H_2$ [vol %] | | | | |
| 1-1 | 2.0 | 39.7 | Balance | 67 | 915 | 63.8 | 1.5 |
| 1-2 | 2.0 | 39.7 | Balance | 67 | 915 | 63.8 | 1.5 |
| 1-3 | 2.0 | 39.7 | Balance | 67 | 915 | 63.8 | 1.5 |
| 1-4 | 2.0 | 39.7 | Balance | 67 | 915 | 63.8 | 1.5 |
| 1-101 | 2.0 | 39.7 | Balance | 67 | 915 | 63.8 | 1.5 |
| 1-102 | 2.0 | 39.7 | Balance | 67 | 915 | 63.8 | 1.5 |
| 1-103 | 2.0 | 39.7 | Balance | 67 | 915 | 63.8 | 1.5 |
| 1-104 | 2.0 | 39.7 | Balance | 67 | 915 | 63.8 | 1.5 |
| 1-5 | 2.0 | 39.7 | Balance | 67 | 915 | 63.8 | 1.5 |
| 1-6 | 2.0 | 39.7 | Balance | 67 | 915 | 63.8 | 1.5 |
| 1-7 | 2.0 | 39.7 | Balance | 67 | 915 | 63.8 | 1.5 |
| 1-8 | 2.0 | 39.7 | Balance | 67 | 915 | 63.8 | 1.5 |
| 1-9 | 2.0 | 39.7 | Balance | 67 | 915 | 63.8 | 1.5 |
| 1-10 | 2.0 | 39.7 | Balance | 67 | 915 | 63.8 | 1.5 |
| 1-11 | 2.0 | 39.7 | Balance | 67 | 915 | 63.8 | 1.5 |
| 1-12 | 2.0 | 39.7 | Balance | 67 | 915 | 63.8 | 1.5 |
| 1-12-1 | — | — | — | — | — | — | — |
| 1-12-2 | 2.0 | 39.7 | Balance | 67 | 915 | 63.8 | 1.5 |
| 1-12-3 | — | — | — | — | — | — | — |

<Second Step>

On the surface of each substrate obtained in the above, a coating film was formed. Specifically, the substrate was set in a reaction furnace of a chemical vapor deposition apparatus to form the coating film on the substrate by the chemical vapor deposition. A condition for forming the coating film is as shown in the following Table 2.

TABLE 2

| Sample No. | First jetting port | | | | | Second jetting port | | | | |
|---|---|---|---|---|---|---|---|---|---|---|
| | | Flow rate | | | | | Flow rate | | | |
| | d1 [mm] | $SiCl_4$ [ml/min] | $N_2$ [L/min] | $CH_3CN$ [mL/min] | $H_2$ [L/min] | d2 [mm] | $TiCl_4$ [ml/min] | $N_2$ [L/min] | $CH_3CN$ [mL/min] | $H_2$ [L/min] |
| 1-1 | 3 | 2.0 | 10 | 1.5 | 60 | 0 | 15.0 | 10 | 1.5 | 40 |
| 1-2 | 3 | 2.0 | 10 | 1.5 | 60 | 0 | 15.0 | 10 | 1.5 | 40 |
| 1-3 | 9 | 2.1 | 10 | 1.5 | 45 | 0 | 15.8 | 10 | 1.5 | 40 |
| 1-4 | 15 | 2.2 | 10 | 1.5 | 20 | 0 | 16.6 | 10 | 1.5 | 40 |
| 1-101 | 0 | 2.0 | 10 | 1.5 | 50 | 0 | 15.0 | 10 | 1.5 | 40 |
| 1-102 | 0 | 2.0 | 10 | 1.5 | 50 | 0 | 15.0 | 10 | 1.5 | 40 |
| 1-103 | 2 | 2.0 | 10 | 1.5 | 40 | 0 | 15.0 | 10 | 1.5 | 40 |
| 1-104 | 0 | 2.0 | 10 | 1.5 | 50 | 0 | 15.0 | 10 | 1.5 | 60 |
| 1-5 | 3 | 2.0 | 10 | — | 60 | 0 | 15.0 | 10 | — | 40 |
| 1-6 | 3 | 2.0 | 10 | — | 60 | 0 | 15.0 | 10 | — | 40 |
| 1-7 | 3 | 2.0 | 10 | — | 60 | 0 | 15.0 | 10 | — | 40 |
| 1-8 | 3 | 2.0 | 10 | — | 60 | 0 | 15.0 | 10 | — | 40 |
| 1-9 | 3 | 2.0 | 10 | 1.5 | 60 | 0 | 15.0 | 10 | 1.5 | 40 |
| 1-10 | 3 | 2.0 | 10 | 0.7 | 60 | 0 | 15.0 | 10 | 0.7 | 40 |
| 1-11 | 3 | 2.0 | 10 | 1.5 | 60 | 0 | 15.0 | 10 | 1.5 | 40 |
| 1-12 | 3 | 2.0 | 10 | 1.5 | 60 | 0 | 15.0 | 10 | 1.5 | 40 |
| 1-12-1 | 3 | 2.0 | 10 | 1.5 | 60 | 0 | 15.0 | 10 | 1.5 | 40 |
| 1-12-2 | 3 | 2.0 | 10 | 1.5 | 60 | 0 | 15.0 | 10 | 1.5 | 40 |
| 1-12-3 | 3 | 2.0 | 10 | 1.5 | 60 | 0 | 15.0 | 10 | 1.5 | 40 |

TABLE 2-continued

| Sample No. | Third jetting port Flow rate CH$_3$CN [ml/min] | H$_2$ [L/min] | Rotation rate of nozzle [rpm] | Film-forming temperature [° C.] | Furnace pressure [mbar] | Film-forming time [hours] |
|---|---|---|---|---|---|---|
| 1-1 | — | — | 0.5 | 870 | 90 | 2.5 |
| 1-2 | — | — | 0.5 | 870 | 90 | 21.0 |
| 1-3 | — | — | 0.5 | 870 | 90 | 2.5 |
| 1-4 | — | — | 0.5 | 870 | 90 | 2.5 |
| 1-101 | — | — | 0.5 | 870 | 90 | 2.5 |
| 1-102 | — | — | 0.5 | 870 | 90 | 2.5 |
| 1-103 | — | — | 0.5 | 870 | 90 | 2.5 |
| 1-104 | — | — | 0.5 | 870 | 90 | 2.5 |
| 1-5 | 3 | 30 | 10.0 | 870 | 90 | 2.5 |
| 1-6 | 3 | 30 | 1.4 | 870 | 90 | 2.5 |
| 1-7 | 3 | 30 | 9.0 | 870 | 90 | 2.5 |
| 1-8 | 3 | 30 | 1.5 | 870 | 90 | 2.5 |
| 1-9 | — | — | 0.5 | 820 | 90 | 2.5 |
| 1-10 | — | — | 0.5 | 880 | 30 | 2.5 |
| 1-11 | — | — | 0.5 | 870 | 90 | 4.0 |
| 1-12 | — | — | 0.5 | 870 | 90 | 20.0 |
| 1-12-1 | — | — | 0.5 | 870 | 90 | 20.0 |
| 1-12-2 | — | — | 0.5 | 870 | 90 | 20.0 |
| 1-12-3 | — | — | 0.5 | 870 | 90 | 20.0 |

<Other Step (Step of Forming Intermediate Layer and Surface Layer)>

To produce the cutting tools of Sample 1-1 to 1-12-1 and 1-101 to 1-104, on the surface of each TiSiCN layer obtained in the above, an intermediate layer (TiCNO layer) and a surface layer (Al$_2$O$_3$ layer) were formed. Specifically, each Sample was set in a reaction furnace of a chemical vapor deposition apparatus, and the chemical vapor deposition was performed under a condition for forming the intermediate layer shown in Table 3 to form the intermediate layer on the TiSiCN layer. Thereafter, the chemical vapor deposition was performed under a condition for forming the surface layer shown in Table 4 to form the surface layer on the intermediate layer.

TABLE 3

| Sample No. | Composition of reaction gas | | | | | Pressure in reaction chamber [mbar] | Substrate temperature [° C.] | Total gas flow rate [L/min] | Keeping time [h] |
|---|---|---|---|---|---|---|---|---|---|
| | TiCl$_4$ [vol %] | CO [vol %] | CH$_4$ [vol %] | N$_2$ [vol %] | H$_2$ [vol %] | | | | |
| 1-1 | 2.1 | 3.2 | 2.8 | 23.7 | Balance | 160 | 1030 | 70.5 | 0.5 |
| 1-2 | 2.1 | 3.2 | 2.8 | 23.7 | Balance | 160 | 1030 | 70.5 | 0.5 |
| 1-3 | 2.1 | 3.2 | 2.8 | 23.7 | Balance | 160 | 1030 | 70.5 | 0.5 |
| 1-4 | 2.1 | 3.2 | 2.8 | 23.7 | Balance | 160 | 1030 | 70.5 | 0.5 |
| 1-101 | 2.1 | 3.2 | 2.8 | 23.7 | Balance | 160 | 1030 | 70.5 | 0.5 |
| 1-102 | 2.1 | 3.2 | 2.8 | 23.7 | Balance | 160 | 1030 | 70.5 | 0.5 |
| 1-103 | 2.1 | 3.2 | 2.8 | 23.7 | Balance | 160 | 1030 | 70.5 | 0.5 |
| 1-104 | 2.1 | 3.2 | 2.8 | 23.7 | Balance | 160 | 1030 | 70.5 | 0.5 |
| 1-5 | 2.1 | 3.2 | 2,8 | 23.7 | Balance | 160 | 1030 | 70.5 | 0.5 |
| 1-6 | 2.1 | 3.2 | 2.8 | 23.7 | Balance | 160 | 1030 | 70.5 | 0.5 |
| 1-7 | 2.1 | 3.2 | 2.8 | 23.7 | Balance | 160 | 1030 | 70.5 | 0.5 |
| 1-8 | 2.1 | 3.2 | 2.8 | 23.7 | Balance | 160 | 1030 | 70.5 | 0.5 |
| 1-9 | 2.1 | 3.2 | 2.8 | 23.7 | Balance | 160 | 1030 | 70.5 | 0.5 |
| 1-10 | 2.1 | 3.2 | 2.8 | 23,7 | Balance | 160 | 1030 | 70.5 | 0.5 |
| 1-11 | 2.1 | 3.2 | 2.8 | 23.7 | Balance | 160 | 1030 | 70.5 | 0.5 |
| 1-12 | 2.1 | 3.2 | 2.8 | 23.7 | Balance | 160 | 1030 | 70.5 | 0.5 |
| 1-12-1 | 2.1 | 3.2 | 2.8 | 23.7 | Balance | 160 | 1030 | 70.5 | 0.5 |
| 1-12-2 | — | — | — | — | — | — | — | — | — |
| 1-12-3 | — | — | — | — | — | — | — | — | — |

TABLE 4

| Sample No. | Composition of reaction gas | | | | | Pressure in reaction chamber [mbar] | Substrate temperature [° C.] | Total gas flow rate [L/min] | Keeping time [h] |
|---|---|---|---|---|---|---|---|---|---|
| | AlCl$_3$ [vol %] | CO$_2$ [vol %] | H$_2$S [vol %] | HCl [vol %] | H$_2$ [vol %] | | | | |
| 1-1 | 1.6 | 4.5 | 0.2 | 3.5 | Balance | 67 | 1000 | 46.2 | 2.0 |
| 1-2 | 1.6 | 4.5 | 0.2 | 3.5 | Balance | 67 | 1000 | 46.2 | 2.0 |
| 1-3 | 1.6 | 4.5 | 0.2 | 3.5 | Balance | 67 | 1000 | 46.2 | 2.0 |
| 1-4 | 1.6 | 4.5 | 0.2 | 3.5 | Balance | 67 | 1000 | 46.2 | 2.0 |
| 1-101 | 1.6 | 4.5 | 0.2 | 3.5 | Balance | 67 | 1000 | 46.2 | 2.0 |
| 1-102 | 1.6 | 4.5 | 0.2 | 3.5 | Balance | 67 | 1000 | 46.2 | 2.0 |
| 1-103 | 1.6 | 4.5 | 0.2 | 3.5 | Balance | 67 | 1000 | 46.2 | 2.0 |
| 1-104 | 1.6 | 4.5 | 0.2 | 3.5 | Balance | 67 | 1000 | 46.2 | 2.0 |
| 1-5 | 1.6 | 4.5 | 0.2 | 3.5 | Balance | 67 | 1000 | 46.2 | 2.0 |
| 1-6 | 1.6 | 4.5 | 0.2 | 3.5 | Balance | 67 | 1000 | 46.2 | 2.0 |
| 1-7 | 1.6 | 4.5 | 0.2 | 3.5 | Balance | 67 | 1000 | 46.2 | 2.0 |
| 1-8 | 1.6 | 4.5 | 0.2 | 3.5 | Balance | 67 | 1000 | 46.2 | 2.0 |
| 1-9 | 1.6 | 4.5 | 0.2 | 3.5 | Balance | 67 | 1000 | 46.2 | 2.0 |
| 1-10 | 1.6 | 4.5 | 0.2 | 3.5 | Balance | 67 | 1000 | 46.2 | 2.0 |
| 1-11 | 1.6 | 4.5 | 0.2 | 3.5 | Balance | 67 | 1000 | 46.2 | 2.0 |
| 1-12 | 1.6 | 4.5 | 0.2 | 3.5 | Balance | 67 | 1000 | 46.2 | 2.0 |
| 1-12-1 | 1.6 | 4.5 | 0.2 | 3.5 | Balance | 67 | 1000 | 46.2 | 2.0 |

TABLE 4-continued

| Sample No. | Composition of reaction gas | | | | | Pressure in reaction chamber [mbar] | Substrate temperature [° C.] | Total gas flow rate [L/min] | Keeping time [h] |
|---|---|---|---|---|---|---|---|---|---|
| | AlCl₃ [vol %] | CO₂ [vol %] | H₂S [vol %] | HCl [vol %] | H₂ [vol %] | | | | |
| 1-12-2 | — | — | — | — | — | — | — | — | — |
| 1-12-3 | — | — | — | — | — | — | — | — | — |

TABLE 5

| Sample No. | Thickness of base layer [μm] | Xr (rake face) | Xe (cutting edge) | Xx-Xe |
|---|---|---|---|---|
| 1-1 | 0.3 | 0.013 | 0.010 | 0.003 |
| 1-2 | 0.3 | 0.013 | 0.010 | 0.003 |
| 1-3 | 0.3 | 0.050 | 0.010 | 0.040 |
| 1-4 | 0.3 | 0.100 | 0.010 | 0.090 |
| 1-101 | 0.3 | 0.010 | 0.010 | 0 |
| 1-102 | 0.3 | 0.013 | 0.013 | 0 |
| 1-103 | 0.3 | 0.012 | 0.010 | 0.002 |
| 1-104 | 0.3 | 0.012 | 0.009 | 0.003 |
| 1-5 | 0.3 | 0.013 | 0.010 | 0.003 |
| 1-6 | 0.3 | 0.013 | 0.010 | 0.003 |
| 1-7 | 0.3 | 0.013 | 0.010 | 0.003 |
| 1-8 | 0.3 | 0.013 | 0.010 | 0.003 |
| 1-9 | 0.3 | 0.013 | 0.010 | 0.003 |
| 1-10 | 0.3 | 0.013 | 0.010 | 0.003 |
| 1-11 | 0.3 | 0.013 | 0.010 | 0.003 |
| 1-12 | 0.3 | 0.013 | 0.010 | 0.003 |
| 1-12-1 | — | 0.013 | 0.010 | 0.003 |
| 1-12-2 | 0.3 | 0.013 | 0.010 | 0.003 |
| 1-12-3 | — | 0.013 | 0.010 | 0.003 |

| Sample No. | Average of periodic widths [nm] | Cross-sectional formulation | Content rate of cubic crystal [vol %] |
|---|---|---|---|
| 1-1 | — | Granular structure | 88 |
| 1-2 | — | Granular structure | 88 |
| 1-3 | — | Granular structure | 88 |
| 1-4 | — | Granular structure | 88 |
| 1-101 | — | Granular structure | 88 |
| 1-102 | — | Granular structure | 88 |
| 1-103 | — | Granular structure | 88 |
| 1-104 | — | Granular structure | 88 |
| 1-5 | 2 | Granular structure | 88 |
| 1-6 | 21 | Granular structure | 88 |
| 1-7 | 3 | Granular structure | 88 |
| 1-8 | 20 | Granular structure | 88 |
| 1-9 | — | Pillar structure | 88 |
| 1-10 | — | Granular structure | 99 |
| 1-11 | — | Granular structure | 88 |
| 1-12 | — | Granular structure | 88 |
| 1-12-1 | — | Granular structure | 88 |
| 1-12-2 | — | Granular structure | 88 |
| 1-12-3 | — | Granular structure | 88 |

| Sample No. | Thickness of TiSiCN layer [μm] | Thickness of intermediate layer [μm] | Thickness of surface layer [μm] | Cutting test Tool lifetime [min] |
|---|---|---|---|---|
| 1-1 | 1.2 | 0.5 | 2.0 | 24 |
| 1-2 | 16 | 0.5 | 2.0 | 27 |
| 1-3 | 1.2 | 0.5 | 2.0 | 27 |
| 1-4 | 1.2 | 0.5 | 2.0 | 29 |
| 1-101 | 1.2 | 0.5 | 2.0 | 18 |
| 1-102 | 1.2 | 0.5 | 2.0 | 18 |
| 1-103 | 1.2 | 0.5 | 2.0 | 19 |
| 1-104 | 1.2 | 0.5 | 2.0 | 16 |
| 1-5 | 1.2 | 0.5 | 2.0 | 30 |
| 1-6 | 1.2 | 0.5 | 2.0 | 30 |
| 1-7 | 1.2 | 0.5 | 2.0 | 35 |
| 1-8 | 1.2 | 0.5 | 2.0 | 34 |
| 1-9 | 1.2 | 0.5 | 2.0 | 30 |
| 1-10 | 1.2 | 0.5 | 2.0 | 31 |
| 1-11 | 2.0 | 0.5 | 2.0 | 28 |
| 1-12 | 15 | 0.5 | 2.0 | 32 |
| 1-12-1 | 15 | 0.5 | 2.0 | 30 |
| 1-12-2 | 15 | — | — | 31 |
| 1-12-3 | 15 | — | — | 30 |

By performing the above steps, the cutting tools of Samples 1-1 to 1-12-3 and 1-101 to 1-104 that had constitutions shown in Table 5 were produced.

<<Evaluation>>

Of the cutting tool of each Sample, Xr; Xe; A:B, an average of periodic widths of a lamellar structure; whether the TiSiCN layer had a pillar structure or not; the content rate of a cubic structure; and the thickness of the TiSiCN layer, were measured.

<Measurements of Xr and Xe>

Of the cutting tools of Samples 1-1 to 1-12-3 and 1-101 to 1-104, the Xr was determined by the method described in Embodiment 1. Each of the obtained results is shown in "Xr (rake face)" of Table 2. Of the cutting tools of Samples 1-1 to 1-12 and 1-101 to 1-104, the Xe was determined by the method described in Embodiment 1. Each of the obtained results is shown in "Xe (cutting edge)" of Table 5.

<Measurement of A:B>

Of the cutting tools of Samples 1-1 to 1-12-3 and 1-101 to 1-104, the A:B in the first TiSiCN layer was determined by the method described in Embodiment 1. As a result, it has been confirmed that all the cutting tools of Samples 1-1 to 1-12-3 and 1-101 to 1-104 have the ratio A:B in the first TiSiCN layer of A:B=1:0.8 to 1.1. Of the cutting tools of Samples 1-1 to 1-12-3 and 1-101 to 1-104, the A:B in the second TiSiCN layer was determined by the method described in Embodiment 1. As a result, it has been confirmed that all the cutting tools of Samples 1-1 to 1-12-3 and 1-101 to 1-104 have the ratio A:B in the second TiSiCN layer of A:B=1:0.8 to 1.1.

<Measurement of Average of Periodic Widths of Lamellar Structure>

Of the cutting tools of Samples 1-1 to 1-12-3 and 1-101 to 1-104, the average of the periodic widths of the lamellar structure was determined by the method described in Embodiment 1. Each of the obtained results is shown in "Average of periodic widths [nm]" of Table 5.

<Specification of Whether TiSiCN Layer has Pillar Structure or Not>

Of the cutting tools of Samples 1-1 to 1-12-3 and 1-101 to 1-104, whether the TiSiCN layer had a pillar structure or not was determined by the method described in Embodiment 1. Each of the obtained results is shown in "Cross-sectional formulation" of Table 5. In "Cross-sectional formulation" of Table 5, "Pillar structure" is referred to "TiSiCN layer having a pillar structure" (in other words, an average aspect ratio of the hard particles is 3 or more), and "Granular structure" is referred to "TiSiCN layer having no pillar structure" (in other words, an average aspect ratio of the hard particles is less than 3).

<Measurement of Content Rate of Cubic Crystalline Structure in TiSiCN Layer>

Of the cutting tools of Samples 1-1 to 1-12-3 and 1-101 to 1-104, the content rate of the cubic crystalline structure in the TiSiCN layer was determined by the method described in Embodiment 1. Each of the obtained results is shown in "Content rate of cubic crystal [vol %]" of Table 5.

<Measurements of Thickness of Base Layer, Thickness of TiSiCN Layer, Thickness of Intermediate Layer, and Thickness of Surface Layer>

Of the cutting tools of Samples 1-1 to 1-12, 1-12-2, and 1-101 to 1-104, the thickness of the base layer was determined by the method described in Embodiment 1. Each of the obtained results is shown in "Thickness of base layer [μm]" of Table 5. Of the cutting tools of Samples 1-1 to 1-12-3 and 1-101 to 1-104, the thickness of the TiSiCN layer was determined by the method described in Embodiment 1. Each of the obtained results is shown in "Thickness of TiSiCN layer [μm]" of Table 5. Of the cutting tools of Samples 1-1 to 1-12-1 and 1-101 to 1-104, the thickness of the intermediate layer was determined by the method described in Embodiment 1. Each of the obtained results is shown in "Thickness of intermediate layer [μm]" of Table 5. Of the cutting tools of Samples 1-1 to 1-12-1 and 1-101 to 1-104, the thickness of the surface layer was determined by the method described in Embodiment 1. Each of the obtained results is shown in "Thickness of surface layer [μm]" of Table 5.

<Cutting Test>

Using the cutting tools of Samples 1-1 to 1-12-3 and 1-101 to 1-104, a cutting time until a wear amount (Vb) of the flank face reached 0.20 mm under the following cutting condition was measured, and a final damage form of the cutting edge was observed. Each of the obtained results is shown in "Tool lifetime [min]" of Table 5. A longer cutting time indicates a longer tool lifetime.

(Cutting Condition)
Workpiece: SCM415 round bar material
Peripheral speed: 200 m/min
Feeding rate: 0.3 mm/rev
Cutting depth: 1.5 mm
Cutting liquid: present This cutting condition corresponds to the intermittent turning of steel.

<Result>

The cutting tools of Samples 1-1 to 1-12-3 correspond to Examples. Samples 1-101 to 1-104 correspond to Comparative Examples. It has been confirmed that the cutting tools of Samples 1-1 to 1-12-3 (Examples) have a longer tool lifetime than the cutting tools of Samples 1-101 to 1-104 (Comparative Examples) even in the intermittent turning of steel.

Example 2

<<Production of Cutting Tool>>

<First Step>

A substrate same as the substrates of Samples 1-1 to 1-12-3 and 1-101 to 1-104 was prepared.

<Other Step (Step of Forming Base Layer)>

To produce cutting tools of Samples 2-1 to 2-11, 2-11-2, and 2-101 to 2-104, a base layer (TiN layer) was formed on a surface of each substrate obtained in the above. Specifically, the substrate was set in a reaction furnace of a chemical vapor deposition apparatus to form the base layer on the substrate by the chemical vapor deposition. A condition for forming the base layer is as shown in the following Table 6.

[Table 6]

TABLE 6

| Sample No. | Composition of reaction gas | | | Pressure in reaction chamber [mbar] | Substrate temperature [° C.] | Total gas flow rate [L/min] | Keeping time [h] |
| --- | --- | --- | --- | --- | --- | --- | --- |
| | TiCl$_4$ [vol %] | N$_2$ [vol %] | H$_2$ [vol %] | | | | |
| 2-1 | 2.0 | 39.7 | Balance | 67 | 915 | 63.8 | 1.5 |
| 2-2 | 2.0 | 39.7 | Balance | 67 | 915 | 63.8 | 1.5 |
| 2-3 | 2.0 | 39.7 | Balance | 67 | 915 | 63.8 | 1.5 |
| 2-101 | 2.0 | 39.7 | Balance | 67 | 915 | 63.8 | 1.5 |
| 2-102 | 2.0 | 39.7 | Balance | 67 | 915 | 63.8 | 1.5 |
| 2-103 | 2.0 | 39.7 | Balance | 67 | 915 | 63.8 | 1.5 |
| 2-104 | 2.0 | 39.7 | Balance | 67 | 915 | 63.8 | 1.5 |
| 2-4 | 2.0 | 39.7 | Balance | 67 | 915 | 63.8 | 1.5 |
| 2-5 | 2.0 | 39.7 | Balance | 67 | 915 | 63.8 | 1.5 |
| 2-6 | 2.0 | 39.7 | Balance | 67 | 915 | 63.8 | 1.5 |
| 2-7 | 2.0 | 39.7 | Balance | 67 | 915 | 63.8 | 1.5 |
| 2-8 | 2.0 | 39.7 | Balance | 67 | 915 | 63.8 | 1.5 |
| 2-9 | 2.0 | 39.7 | Balance | 67 | 915 | 63.8 | 1.5 |
| 2-10 | 2.0 | 39.7 | Balance | 67 | 915 | 63.8 | 1.5 |
| 2-11 | 2.0 | 39.7 | Balance | 67 | 915 | 63.8 | 1.5 |
| 2-11-1 | — | — | — | — | — | — | — |
| 2-11-2 | 2.0 | 39.7 | Balance | 67 | 915 | 63.8 | 1.5 |
| 2-11-3 | — | — | — | — | — | — | — |

<Second Step>

On the surface of each substrate obtained in the above, a coating film was formed. Specifically, the substrate was set in a reaction furnace of a chemical vapor deposition apparatus to form the coating film on the substrate by the chemical vapor deposition. A condition for forming the coating film is as shown in the following Table 7.

TABLE 7

| | First jetting port | | | |
|---|---|---|---|---|
| | | Flow rate | | |
| Sample No. | d1 [mm] | SiCl$_4$ [ml/min] | N$_2$ [L/min] | CH$_3$CN [mL/min] | H$_2$ [L/min] |
| 2-1 | 3 | 5.0 | 10 | 1.5 | 60 |
| 2-2 | 3 | 5.5 | 10 | 1.5 | 60 |
| 2-3 | 9 | 5.8 | 10 | 1.5 | 45 |
| 2-101 | 0 | 5.0 | 10 | 1.5 | 50 |
| 2-102 | 0 | 5.0 | 10 | 1.5 | 50 |
| 2-103 | 2 | 5.0 | 10 | 1.5 | 40 |
| 2-104 | 11 | 6.5 | 10 | 1.5 | 30 |
| 2-4 | 0 | 5.0 | 10 | — | 50 |
| 2-5 | 3 | 5.0 | 10 | — | 60 |
| 2-6 | 3 | 5.0 | 10 | — | 60 |
| 2-7 | 3 | 5.0 | 10 | — | 60 |
| 2-8 | 3 | 5.0 | 10 | 1.5 | 60 |
| 2-9 | 3 | 5.0 | 10 | 0.7 | 60 |
| 2-10 | 3 | 5.0 | 10 | 1.5 | 60 |
| 2-11 | 3 | 5.0 | 10 | 1.5 | 60 |
| 2-11-1 | 3 | 5.0 | 10 | 1.5 | 60 |
| 2-11-2 | 3 | 5.0 | 10 | 1.5 | 60 |
| 2-11-3 | 3 | 5.0 | 10 | 1.5 | 60 |

| | Second jetting port | | | |
|---|---|---|---|---|
| | | Flow rate | | |
| Sample No. | d2 [mm] | TiCl$_4$ ml/min | N$_2$ [L/min] | CH$_3$CN [mL/min] | H$_2$ [L/min] |
| 2-1 | 0 | 13.0 | 10 | 1.5 | 40 |
| 2-2 | 0 | 14.3 | 10 | 1.5 | 40 |
| 2-3 | 0 | 15.6 | 10 | 1.5 | 40 |
| 2-101 | 0 | 13.0 | 10 | 1.5 | 40 |
| 2-102 | 0 | 13.0 | 10 | 1.5 | 40 |
| 2-103 | 0 | 13.0 | 10 | 1.5 | 40 |
| 2-104 | 0 | 13.0 | 10 | 1.5 | 40 |
| 2-4 | 0 | 13.0 | 10 | — | 60 |
| 2-5 | 0 | 13.0 | 10 | — | 40 |
| 2-6 | 0 | 13.0 | 10 | — | 40 |
| 2-7 | 0 | 13.0 | 10 | — | 40 |
| 2-8 | 0 | 13.0 | 10 | 1.5 | 40 |
| 2-9 | 0 | 13.0 | 10 | 0.7 | 40 |
| 2-10 | 0 | 13.0 | 10 | 1.5 | 40 |
| 2-11 | 0 | 13.0 | 10 | 1.5 | 40 |
| 2-11-1 | 0 | 13.0 | 10 | 1.5 | 40 |
| 2-11-2 | 0 | 13.0 | 10 | 1.5 | 40 |
| 2-11-3 | 0 | 13.0 | 10 | 1.5 | 40 |

TABLE 7-continued

| | Third jetting port | | Rotation rate of nozzle [rpm] | Film-forming temperature [° C.] | Furnace pressure [mbar] | Film-forming time [hours] |
|---|---|---|---|---|---|---|
| | Flow rate | | | | | |
| Sample No. | CH$_3$CN [ml/min] | H$_2$ [L/min] | | | | |
| 2-1 | — | — | 0.5 | 880 | 90 | 2.4 |
| 2-2 | — | — | 0.5 | 880 | 90 | 20.5 |
| 2-3 | — | — | 0.5 | 880 | 90 | 2.4 |
| 2-101 | — | — | 0.5 | 880 | 90 | 2.4 |
| 2-102 | — | — | 0.5 | 880 | 90 | 2.4 |
| 2-103 | — | — | 0.5 | 880 | 90 | 2.4 |
| 2-104 | — | — | 0.5 | 880 | 90 | 2.4 |
| 2-4 | 3 | 30 | 10.0 | 880 | 90 | 2.4 |
| 2-5 | 3 | 30 | 1.4 | 880 | 90 | 2.4 |
| 2-6 | 3 | 30 | 9.0 | 880 | 90 | 2.4 |
| 2-7 | 3 | 30 | 1.5 | 880 | 90 | 2.4 |
| 2-8 | — | — | 0.5 | 840 | 90 | 2.4 |
| 2-9 | — | — | 0.5 | 880 | 30 | 2.4 |
| 2-10 | — | — | 0.5 | 880 | 90 | 4.0 |
| 2-11 | — | — | 0.5 | 880 | 90 | 19.8 |
| 2-11-1 | — | — | 0.5 | 880 | 90 | 19.8 |
| 2-11-2 | — | — | 0.5 | 880 | 90 | 19.8 |
| 2-11-3 | — | — | 0.5 | 880 | 90 | 19.8 |

<Other Step (Step of Forming Intermediate Layer and Surface Layer)>

To produce the cutting tools of Sample 2-1 to 2-11-1 and 2-101 to 2-104, on the surface of each TiSiCN layer obtained in the above, an intermediate layer (TiCNO layer) and a surface layer (Al$_2$O$_3$ layer) were formed. Specifically, each Sample was set in a reaction furnace of a chemical vapor deposition apparatus, and the chemical vapor deposition was performed under a condition for forming the intermediate layer shown in Table 8 to form the intermediate layer on the TiSiCN layer. Thereafter, the chemical vapor deposition was performed under a condition for forming the surface layer shown in Table 9 to form the surface layer on the intermediate layer.

TABLE 8

| Sample No. | Composition of reaction gas | | | | |
|---|---|---|---|---|---|
| | TiCl$_4$ [vol %] | CO [vol %] | CH$_4$ [vol %] | N$_2$ [vol %] | H$_2$ [vol %] |
| 2-1 | 2.1 | 3.2 | 2.8 | 23.7 | Balance |
| 2-2 | 2.1 | 3.2 | 2.8 | 23.7 | Balance |
| 2-3 | 2.1 | 3.2 | 2.8 | 23.7 | Balance |
| 2-101 | 2.1 | 3.2 | 2.8 | 23.7 | Balance |
| 2-102 | 2.1 | 3.2 | 2.8 | 23.7 | Balance |
| 2-103 | 2.1 | 3.2 | 2.8 | 23.7 | Balance |
| 2-104 | 2.1 | 3.2 | 2.8 | 23.7 | Balance |
| 2-4 | 2.1 | 3.2 | 2.8 | 23.7 | Balance |
| 2-5 | 2.1 | 3.2 | 2.8 | 23.7 | Balance |
| 2-6 | 2.1 | 3.2 | 2.8 | 23.7 | Balance |
| 2-7 | 2.1 | 3.2 | 2.8 | 23.7 | Balance |
| 2-8 | 2.1 | 3.2 | 2.8 | 23.7 | Balance |
| 2-9 | 2.1 | 3.2 | 2.8 | 23.7 | Balance |
| 2-10 | 2.1 | 3.2 | 2.8 | 23.7 | Balance |
| 2-11 | 2.1 | 3.2 | 2.8 | 23.7 | Balance |
| 2-11-1 | 2.1 | 3.2 | 2.8 | 23.7 | Balance |
| 2-11-2 | — | — | — | — | — |
| 2-11-3 | — | — | — | — | — |

TABLE 8-continued

| Sample No. | Pressure in reaction chamber [mbar] | Substrate temperature [° C.] | Total gas flow rate [L/min] | Keeping time [h] |
| --- | --- | --- | --- | --- |
| 2-1 | 160 | 1030 | 70.5 | 0.5 |
| 2-2 | 160 | 1030 | 70.5 | 0.5 |
| 2-3 | 160 | 1030 | 70.5 | 0.5 |
| 2-101 | 160 | 1030 | 70.5 | 0.5 |
| 2-102 | 160 | 1030 | 70.5 | 0.5 |
| 2-103 | 160 | 1030 | 70.5 | 0.5 |
| 2-104 | 160 | 1030 | 70.5 | 0.5 |
| 2-4 | 160 | 1030 | 70.5 | 0.5 |
| 2-5 | 160 | 1030 | 70.5 | 0.5 |
| 2-6 | 160 | 1030 | 70.5 | 0.5 |
| 2-7 | 160 | 1030 | 70.5 | 0.5 |
| 2-8 | 160 | 1030 | 70.5 | 0.5 |
| 2-9 | 160 | 1030 | 70.5 | 0.5 |
| 2-10 | 160 | 1030 | 70.5 | 0.5 |
| 2-11 | 160 | 1030 | 70.5 | 0.5 |
| 2-11-1 | 160 | 1030 | 70.5 | 0.5 |
| 2-11-2 | — | — | — | — |
| 2-11-3 | — | — | — | — |

TABLE 9

| Sample No. | Composition of reaction gas | | | | | Pressure in reaction chamber [mbar] | Substrate temperature [° C.] | Total gas flow rate [L/min] | Keeping time [h] |
| --- | --- | --- | --- | --- | --- | --- | --- | --- | --- |
| | $AlCl_3$ [vol %] | $CO_2$ [vol %] | $H_2S$ [vol %] | HCl [vol %] | $H_2$ [vol %] | | | | |
| 2-1 | 1.6 | 4.5 | 0.2 | 3.5 | Balance | 67 | 1000 | 46.2 | 2.0 |
| 2-2 | 1.6 | 4.5 | 0.2 | 3.5 | Balance | 67 | 1000 | 46.2 | 2.0 |
| 2-3 | 1.6 | 4.5 | 0.2 | 3.5 | Balance | 67 | 1000 | 46.2 | 2.0 |
| 2-101 | 1.6 | 4.5 | 0.2 | 3.5 | Balance | 67 | 1000 | 46.2 | 2.0 |
| 2-102 | 1.6 | 4.5 | 0.2 | 3.5 | Balance | 67 | 1000 | 46.2 | 2.0 |
| 2-103 | 1.6 | 4.5 | 0.2 | 3.5 | Balance | 67 | 1000 | 46.2 | 2.0 |
| 2-104 | 1.6 | 4.5 | 0.2 | 3.5 | Balance | 67 | 1000 | 46.2 | 2.0 |
| 2-4 | 1.6 | 4.5 | 0.2 | 3.5 | Balance | 67 | 1000 | 46.2 | 2.0 |
| 2-5 | 1.6 | 4.5 | 0.2 | 3.5 | Balance | 67 | 1000 | 46.2 | 2.0 |
| 2-6 | 1.6 | 4.5 | 0.2 | 3.5 | Balance | 67 | 1000 | 46.2 | 2.0 |
| 2-7 | 1.6 | 4.5 | 0.2 | 3.5 | Balance | 67 | 1000 | 46.2 | 2.0 |
| 2-8 | 1.6 | 4.5 | 0.2 | 3.5 | Balance | 67 | 1000 | 46.2 | 2.0 |
| 2-9 | 1.6 | 4.5 | 0.2 | 3.5 | Balance | 67 | 1000 | 46.2 | 2.0 |
| 2-10 | 1.6 | 4.5 | 0.2 | 3.5 | Balance | 67 | 1000 | 46.2 | 2.0 |
| 2-11 | 1.6 | 4.5 | 0.2 | 3.5 | Balance | 67 | 1000 | 46.2 | 2.0 |
| 2-11-1 | 1.6 | 4.5 | 0.2 | 3.5 | Balance | 67 | 1000 | 46.2 | 2.0 |
| 2-11-2 | — | — | — | — | — | — | — | — | — |
| 2-11-3 | — | — | — | — | — | — | — | — | — |

TABLE 10

| Sample No. | Thickness of base layer [μm] | Xr (rake face) | Xe (cutting edge) | Xr-Xe | Average of periodic widths [nm] | Cross-sectional formulation | Content rate of cubic crystal [vol %] | Thickness of TiSiCN layer [μm] | Thickness of intermediate layer [μm] | Thickness of surface layer [μm] | Cutting test Tool lifetime [min] |
| --- | --- | --- | --- | --- | --- | --- | --- | --- | --- | --- | --- |
| 2-1 | 0.3 | 0.053 | 0.050 | 0.003 | — | Granular structure | 85 | 1.2 | 0.5 | 2.0 | 20 |
| 2-2 | 0.3 | 0.053 | 0.050 | 0.003 | — | Granular structure | 85 | 16 | 0.5 | 2.0 | 21 |
| 2-3 | 0.3 | 0.100 | 0.050 | 0.050 | — | Granular structure | 85 | 1.2 | 0.5 | 2.0 | 23 |
| 2-101 | 0.3 | 0.050 | 0.050 | 0 | — | Granular structure | 85 | 1.2 | 0.5 | 2.0 | 15 |
| 2-102 | 0.3 | 0.053 | 0.053 | 0 | — | Granular structure | 85 | 1.2 | 0.5 | 2.0 | 16 |
| 2-103 | 0.3 | 0.052 | 0.050 | 0.002 | — | Granular structure | 85 | 1.2 | 0.5 | 2.0 | 15 |
| 2-104 | 0.3 | 0.101 | 0.050 | 0.051 | — | Granular structure | 85 | 1.2 | 0.5 | 2.0 | 16 |
| 2-4 | 0.3 | 0.053 | 0.050 | 0.003 | 2 | Granular structure | 85 | 1.2 | 0.5 | 2.0 | 25 |
| 2-5 | 0.3 | 0.053 | 0.050 | 0.003 | 21 | Granular structure | 85 | 1.2 | 0.5 | 2.0 | 27 |
| 2-6 | 0.3 | 0.053 | 0.050 | 0.003 | 3 | Granular structure | 85 | 1.2 | 0.5 | 2.0 | 30 |
| 2-7 | 0.3 | 0.053 | 0.050 | 0.003 | 20 | Granular structure | 85 | 1.2 | 0.5 | 2.0 | 30 |
| 2-8 | 0.3 | 0.053 | 0.050 | 0.003 | — | Pillar structure | 85 | 1.2 | 0.5 | 2.0 | 27 |

TABLE 10-continued

| Sample No. | Thickness of base layer [μm] | Xr (rake face) | Xe (cutting edge) | Xr-Xe | Average of periodic widths [nm] | Cross-sectional formulation | Content rate of cubic crystal [vol %] | Thickness of TiSiCN layer [μm] | Thickness of intermediate layer [μm] | Thickness of surface layer [μm] | Cutting test Tool lifetime [min] |
|---|---|---|---|---|---|---|---|---|---|---|---|
| 2-9 | 0.3 | 0.053 | 0.050 | 0.003 | — | Granular structure | 98 | 1.2 | 0.5 | 2.0 | 29 |
| 2-10 | 0.3 | 0.053 | 0.050 | 0.003 | — | Granular structure | 85 | 2.0 | 0.5 | 2.0 | 25 |
| 2-11 | 0.3 | 0.053 | 0.050 | 0.003 | — | Granular structure | 85 | 15 | 0.5 | 2.0 | 26 |
| 2-11-1 | — | 0.053 | 0.050 | 0.003 | — | Granular structure | 85 | 15 | 0.5 | 2.0 | 24 |
| 2-11-2 | 0.3 | 0.053 | 0.050 | 0.003 | — | Granular structure | 85 | 15 | — | — | 25 |
| 2-11-3 | — | 0.053 | 0.050 | 0.003 | — | Granular structure | 85 | 15 | — | — | 24 |

By performing the above steps, the cutting tools of Samples 2-1 to 2-11-3 and 2-101 to 2-104 that had constitutions shown in Table 10 were produced.

<<Evaluation>>

Of the cutting tool of each Sample, Xr; Xe; A:B, an average of periodic widths of a lamellar structure; whether the TiSiCN layer had a pillar structure or not, the content rate of a cubic structure; and the thickness of the TiSiCN layer were measured.

<Measurements of Xr and Xe>

Of the cutting tools of Samples 2-1 to 2-11-3 and 2-101 to 2-104, the Xr was determined by the method described in Embodiment 1. Each of the obtained results is shown in "Xr (rake face)" of Table 10. Of the cutting tools of Samples 2-1 to 2-11-3 and 2-101 to 2-104, the Xe was determined by the method described in Embodiment 1. Each of the obtained results is shown in "Xe (cutting edge)" of Table 10.

<Measurement of A:B>

Of the cutting tools of Samples 2-1 to 2-11 and 2-101 to 2-104, the A:B was determined by the method described in Embodiment 1. As a result, it has been confirmed that all the cutting tools of Samples 2-1 to 2-11 and 2-101 to 2-104 have the ratio A:B of A:B=1:0.8 to 1.1. Of the cutting tools of Samples 2-1 to 2-11 and 2-101 to 2-104, the A:B in the second TiSiCN layer was determined by the method described in Embodiment 1. As a result, it has been confirmed that all the cutting tools of Samples 2-1 to 2-11 and 2-101 to 2-104 have the ratio A:B in the second TiSiCN layer of A:B=1:0.8 to 1.1.

<Measurement of Average of Periodic Widths of Lamellar Structure>

Of the cutting tools of Samples 2-1 to 2-11-3 and 2-101 to 2-104, the average of the periodic widths of the lamellar structure was determined by the method described in Embodiment 1. Each of the obtained results is shown in "Average of periodic widths [nm]" of Table 10.

<Specification of Whether TiSiCN Layer has Pillar Structure or Not>

Of the cutting tools of Samples 2-1 to 2-11-3 and 2-101 to 2-104, whether the TiSiCN layer had a pillar structure or not was determined by the method described in Embodiment 1. Each of the obtained results is shown in "Cross-sectional formulation" of Table 10 In "Cross-sectional formulation" of Table 10, "Pillar structure" is referred to "TiSiCN layer having a pillar structure" (in other words, an average aspect ratio of the hard particles is 3 or more), and "Granular structure" is referred to "TiSiCN layer having no pillar structure" (in other words, an average aspect ratio of the hard particles is less than 3).

<Measurement of Content Rate of Cubic Crystalline Structure in TiSiCN Layer>

Of the cutting tools of Samples 2-1 to 2-11-3 and 2-101 to 2-104, the content rate of the cubic crystalline structure in the TiSiCN layer was determined by the method described in Embodiment 1. Each of the obtained results is shown in "Content rate of cubic crystal [vol %]" of Table 10.

<Measurements of Thickness of Base Layer, Thickness of TiSiCN Layer, Thickness of Intermediate Layer, and Thickness of Surface Layer>

Of the cutting tools of Samples 2-1 to 2-11, 2-11-2, and 2-101 to 2-104, the thickness of the base layer was determined by the method described in Embodiment 1. Each of the obtained results is shown in "Thickness of base layer [μm]" of Table 10. Of the cutting tools of Samples 2-1 to 2-11-3, and 2-101 to 2-104, the thickness of the TiSiCN layer was determined by the method described in Embodiment 1. Each of the obtained results is shown in "Thickness of TiSiCN layer [μm]" of Table 10 Of the cutting tools of Samples 2-1 to 2-11-1, and 2-101 to 2-104, the thickness of the intermediate layer was determined by the method described in Embodiment 1. Each of the obtained results is shown in "Thickness of intermediate layer [μm]" of Table 10. Of the cutting tools of Samples 2-1 to 2-11-1, and 2-101 to 2-104, the thickness of the surface layer was determined by the method described in Embodiment 1. Each of the obtained results is shown in "Thickness of surface layer [μm]" of Table 10.

<Cutting Test>

Using the cutting tools of Samples 2-1 to 2-11-3 and 2-101 to 2-104, a cutting time until a wear amount (Vb) of the flank face reached 0.20 mm under the following cutting condition was measured, and a final damage form of the cutting edge was observed. Each of the obtained results is shown in "Tool lifetime [min]" of Table 10. A longer cutting time indicates a longer tool lifetime.

(Cutting Condition)
Workpiece: S50C round bar material
Peripheral speed: 220 m/min
Feeding rate: 0.3 mm/rev
Cutting depth: 1.5 mm
Cutting liquid: present This cutting condition corresponds to the intermittent turning of steel.

<Result>

The cutting tools of Samples 2-1 to 2-11-3 correspond to Examples. Samples 2-101 to 2-104 correspond to Comparative Examples. It has been confirmed that the cutting tools of Samples 2-1 to 2-11-3 (Examples) have a longer tool lifetime than the cutting tools of Samples 2-101 to 2-104 (Comparative Examples) even in the intermittent turning of steel.

Example 3

<<Production of Cutting Tool>>
<First Step>

A substrate same as the substrates of Samples 1-1 to 1-12-3 and 1-101 to 1-104 was prepared.

<Other Step (Step of Forming Base Layer)>

To produce cutting tools of Samples 3-1 to 3-10, 3-10-2, and 3-101 to 3-104, a base layer (TiN layer) was formed on a surface of each substrate obtained in the above. Specifically, the substrate was set in a reaction furnace of a chemical vapor deposition apparatus to form the base layer on the substrate by the chemical vapor deposition. A condition for forming the base layer was as shown in the following Table 11.

TABLE 11

| Sample No. | Composition of reaction gas | | | Pressure in reaction chamber [mbar] | Substrate temperature [° C.] | Total gas flow rate [L/min] | Keeping time [h] |
|---|---|---|---|---|---|---|---|
| | TiCl$_4$ [vol %] | N$_2$ [vol %] | H$_2$ [vol %] | | | | |
| 3-1 | 2.0 | 39.7 | Balance | 67 | 915 | 63.8 | 1.5 |
| 3-2 | 2.0 | 39.7 | Balance | 67 | 915 | 63.8 | 1.5 |
| 3-101 | 2.0 | 39.7 | Balance | 67 | 915 | 63.8 | 1.5 |
| 3-102 | 2.0 | 39.7 | Balance | 67 | 915 | 63.8 | 1.5 |
| 3-103 | 2.0 | 39.7 | Balance | 67 | 915 | 63.8 | 1.5 |
| 3-104 | 2.0 | 39.7 | Balance | 67 | 915 | 63.8 | 1.5 |
| 3-3 | 2.0 | 39.7 | Balance | 67 | 915 | 63.8 | 1.5 |
| 3-4 | 2.0 | 39.7 | Balance | 67 | 915 | 63.8 | 1.5 |
| 3-5 | 2.0 | 39.7 | Balance | 67 | 915 | 63.8 | 1.5 |
| 3-6 | 2.0 | 39.7 | Balance | 67 | 915 | 63.8 | 1.5 |
| 3-7 | 2.0 | 39.7 | Balance | 67 | 915 | 63.8 | 1.5 |
| 3-8 | 2.0 | 39.7 | Balance | 67 | 915 | 63.8 | 1.5 |
| 3-9 | 2.0 | 39.7 | Balance | 67 | 915 | 63.8 | 1.5 |
| 3-10 | 2.0 | 39.7 | Balance | 67 | 915 | 63.8 | 1.5 |
| 3-10-1 | — | — | — | — | — | — | — |
| 3-10-2 | 2.0 | 39.7 | Balance | 67 | 915 | 63.8 | 1.5 |
| 3-10-3 | — | — | — | — | — | — | — |

<Second Step>

On the surface of each substrate obtained in the above, a coating film was formed. Specifically, the substrate was set in a reaction furnace of a chemical vapor deposition apparatus to form the coating film on the substrate by the chemical vapor deposition. A condition for forming the coating film is as shown in the following Table 12.

TABLE 12

| | | First jetting port | | | |
|---|---|---|---|---|---|
| | | | Flow rate | | |
| Sample No. | d1 [mm] | SiCl$_4$ [ml/min] | N$_2$ [L/min] | CH$_3$CN [mL/min] | H2 [L/min] |
| 3-1 | 3 | 5.0 | 10 | 1.5 | 60 |
| 3-2 | 3 | 5.0 | 10 | 1.5 | 60 |
| 3-101 | 0 | 5.0 | 10 | 1.5 | 60 |
| 3-102 | 0 | 5.0 | 10 | 1.5 | 60 |
| 3-103 | 2 | 5.0 | 10 | 1.5 | 60 |
| 3-104 | 3 | 6.1 | 10 | 1.5 | 60 |
| 3-3 | 3 | 5.0 | 10 | — | 60 |
| 3-4 | 3 | 5.0 | 10 | — | 60 |
| 3-5 | 3 | 5.0 | 10 | — | 60 |
| 3-6 | 3 | 5.0 | 10 | — | 60 |
| 3-7 | 3 | 5.0 | 10 | 1.5 | 60 |
| 3-8 | 3 | 5.0 | 10 | 0.7 | 60 |
| 3-9 | 3 | 5.0 | 10 | 1.5 | 60 |
| 3-10 | 3 | 5.0 | 10 | 1.5 | 60 |

TABLE 12-continued

| | | | | |
|---|---|---|---|---|
| 3-10-1 | 3 | 5.0 | 10 | 1.5 | 60 |
| 3-10-2 | 3 | 5.0 | 10 | 1.5 | 60 |
| 3-10-3 | 3 | 5.0 | 10 | 1.5 | 60 |

| | Second jetting port | | | |
|---|---|---|---|---|
| | | Flow rate | | |
| Sample No. | d2 [mm] | TiCl$_4$ ml/min | N$_2$ [L/min] | CH$_3$CN [ml/min] | H$_2$ [L/min] |
| 3-1 | 0 | 10 | 10 | 1.5 | 40 |
| 3-2 | 0 | 10 | 10 | 1.5 | 40 |
| 3-101 | 0 | 10 | 10 | 1.5 | 40 |
| 3-102 | 0 | 10 | 10 | 1.5 | 40 |
| 3-103 | 0 | 10 | 10 | 1.5 | 40 |
| 3-104 | 0 | 10 | 10 | 1.5 | 40 |
| 3-3 | 0 | 10 | 10 | — | 60 |
| 3-4 | 0 | 10 | 10 | — | 40 |
| 3-5 | 0 | 10 | 10 | — | 40 |
| 3-6 | 0 | 10 | 10 | — | 40 |
| 3-7 | 0 | 10 | 10 | 1.5 | 40 |
| 3-8 | 0 | 10 | 10 | 0.7 | 40 |
| 3-9 | 0 | 10 | 10 | 1.5 | 40 |
| 3-10 | 0 | 10 | 10 | 1.5 | 40 |
| 3-10-1 | 0 | 10 | 10 | 1.5 | 40 |
| 3-10-2 | 0 | 10 | 10 | 1.5 | 40 |
| 3-10-3 | 0 | 10 | 10 | 1.5 | 40 |

| | Third jetting port | | Rotation rate of nozzle [rpm] | Film-forming temperature [° C.] | Furnace pressure [mbar] | Film-forming time [hours] |
|---|---|---|---|---|---|---|
| | Flow rate | | | | | |
| Sample No. | CH$_3$CN [ml/min] | H$_2$ [L/min] | | | | |
| 3-1 | — | — | 0.5 | 890 | 90 | 2.0 |
| 3-2 | — | — | 0.5 | 890 | 90 | 20.5 |
| 3-101 | — | — | 0.5 | 890 | 30 | 2.4 |
| 3-102 | — | — | 0.5 | 890 | 90 | 2.4 |
| 3-103 | — | — | 0.5 | 890 | 90 | 2.4 |
| 3-104 | — | — | 0.5 | 890 | 90 | 2.4 |
| 3-3 | 3 | 30 | 10.0 | 890 | 90 | 2.4 |
| 3-4 | 3 | 30 | 1.4 | 890 | 90 | 2.4 |
| 3-5 | 3 | 30 | 9.0 | 890 | 90 | 2.4 |
| 3-6 | 3 | 30 | 1.5 | 890 | 90 | 2.4 |
| 3-7 | — | — | 0.5 | 860 | 90 | 2.4 |
| 3-8 | — | — | 0.5 | 890 | 30 | 2.4 |
| 3-9 | — | — | 0.5 | 890 | 90 | 4.0 |
| 3-10 | — | — | 0.5 | 890 | 90 | 19.5 |
| 3-10-1 | — | — | 0.5 | 890 | 90 | 19.5 |
| 3-10-2 | — | — | 0.5 | 890 | 90 | 19.5 |
| 3-10-3 | — | — | 0.5 | 890 | 90 | 19.5 |

<Other Step (Step of Forming Intermediate Layer and Surface Layer)>

To produce the cutting tools of Samples 3-1 to 3-10-1 and 3-101 to 3-104, on the surface of each TiSiCN layer obtained in the above, an intermediate layer (TiCNO layer) and a surface layer (Al$_2$O$_3$ layer) were formed. Specifically, each Sample was set in a reaction furnace of a chemical vapor deposition apparatus, and the chemical vapor deposition was performed under a condition for forming the intermediate layer shown in Table 13 to form the intermediate layer on the TiSiCN layer. Thereafter, the chemical vapor deposition was performed under a condition for forming the surface layer shown in Table 14 to form the surface layer on the intermediate layer.

TABLE 13

| Sample No. | Composition of reaction gas | | | | | Pressure in reaction chamber [mbar] | Substrate temperature [° C.] | Total gas flow rate [L/min] | Keeping time [h] |
|---|---|---|---|---|---|---|---|---|---|
| | TiCl$_4$ [vol %] | CO [vol %] | CH$_4$ [vol %] | N$_2$ [vol %] | H$_2$ [vol %] | | | | |
| 3-1 | 2.1 | 3.2 | 2.8 | 23.7 | Balance | 160 | 1030 | 70.5 | 0.5 |
| 3-2 | 2.1 | 3.2 | 2.8 | 23.7 | Balance | 160 | 1030 | 70.5 | 0.5 |
| 3-101 | 2.1 | 3.2 | 2.8 | 23.7 | Balance | 160 | 1030 | 70.5 | 0.5 |
| 3-102 | 2.1 | 3.2 | 2.8 | 23.7 | Balance | 160 | 1030 | 70.5 | 0.5 |
| 3-103 | 2.1 | 3.2 | 2.8 | 23.7 | Balance | 160 | 1030 | 70.5 | 0.5 |
| 3-104 | 2.1 | 3.2 | 2.8 | 23.7 | Balance | 160 | 1030 | 70.5 | 0.5 |

TABLE 13-continued

| Sample No. | Composition of reaction gas | | | | | Pressure in reaction chamber [mbar] | Substrate temperature [° C.] | Total gas flow rate [L/min] | Keeping time [h] |
| --- | --- | --- | --- | --- | --- | --- | --- | --- | --- |
| | TiCl$_4$ [vol %] | CO [vol %] | CH$_4$ [vol %] | N$_2$ [vol %] | H$_2$ [vol %] | | | | |
| 3-3 | 2.1 | 3.2 | 2.8 | 23.7 | Balance | 160 | 1030 | 70.5 | 0.5 |
| 3-4 | 2.1 | 3.2 | 2.8 | 23.7 | Balance | 160 | 1030 | 70.5 | 0.5 |
| 3-5 | 2.1 | 3.2 | 2.8 | 23.7 | Balance | 160 | 1030 | 70.5 | 0.5 |
| 3-6 | 2.1 | 3.2 | 2.8 | 23.7 | Balance | 160 | 1030 | 70.5 | 0.5 |
| 3-7 | 2.1 | 3.2 | 2.8 | 23.7 | Balance | 160 | 1030 | 70.5 | 0.5 |
| 3-8 | 2.1 | 3.2 | 2.8 | 23.7 | Balance | 160 | 1030 | 70.5 | 0.5 |
| 3-9 | 2.1 | 3.2 | 2.8 | 23.7 | Balance | 160 | 1030 | 70.5 | 0.5 |
| 3-10 | 2.1 | 3.2 | 2.8 | 23.7 | Balance | 160 | 1030 | 70.5 | 0.5 |
| 3-10-1 | 2.1 | 3.2 | 2.8 | 23.7 | Balance | 160 | 1030 | 70.5 | 0.5 |
| 3-10-2 | — | — | — | — | — | — | — | — | — |
| 3-10-3 | — | — | — | — | — | — | — | — | — |

TABLE 14

| Sample No. | Composition of reaction gas | | | | | Pressure in reaction chamber [mbar] | Substrate temperature [° C.] | Total gas flow rate [L/min] | Keeping time [h] |
| --- | --- | --- | --- | --- | --- | --- | --- | --- | --- |
| | AlCl$_3$ [vol %] | CO$_2$ [vol %] | H$_2$S [vol %] | HCl [vol %] | H$_2$ [vol %] | | | | |
| 3-1 | 1.6 | 4.5 | 0.2 | 3.5 | Balance | 67 | 1000 | 46.2 | 2.0 |
| 3-2 | 1.6 | 4.5 | 0.2 | 3.5 | Balance | 67 | 1000 | 46.2 | 2.0 |
| 3-101 | 1.6 | 4.5 | 0.2 | 3.5 | Balance | 67 | 1000 | 46.2 | 2.0 |
| 3-102 | 1.6 | 4.5 | 0.2 | 3.5 | Balance | 67 | 1000 | 46.2 | 2.0 |
| 3-103 | 1.6 | 4.5 | 0.2 | 3.5 | Balance | 67 | 1000 | 46.2 | 2.0 |
| 3-104 | 1.6 | 4.5 | 0.2 | 3.5 | Balance | 67 | 1000 | 46.2 | 2.0 |
| 3-3 | 1.6 | 4.5 | 0.2 | 3.5 | Balance | 67 | 1000 | 46.2 | 2.0 |
| 3-4 | 1.6 | 4.5 | 0.2 | 3.5 | Balance | 67 | 1000 | 46.2 | 2.0 |
| 3-5 | 1.6 | 4.5 | 0.2 | 3.5 | Balance | 67 | 1000 | 46.2 | 2.0 |
| 3-6 | 1.6 | 4.5 | 0.2 | 3.5 | Balance | 67 | 1000 | 46.2 | 2.0 |
| 3-7 | 1.6 | 4.5 | 0.2 | 3.5 | Balance | 67 | 1000 | 46.2 | 2.0 |
| 3-8 | 1.6 | 4.5 | 0.2 | 3.5 | Balance | 67 | 1000 | 46.2 | 2.0 |
| 3-9 | 1.6 | 4.5 | 0.2 | 3.5 | Balance | 67 | 1000 | 46.2 | 2.0 |
| 3-10 | 1.6 | 4.5 | 0.2 | 3.5 | Balance | 67 | 1000 | 46.2 | 2.0 |
| 3-10-1 | 1.6 | 4.5 | 0.2 | 3.5 | Balance | 67 | 1000 | 46.2 | 2.0 |
| 3-10-2 | — | — | — | — | — | — | — | — | — |
| 3-10-3 | — | — | — | — | — | — | — | — | — |

TABLE 15

| Sample No. | Thickness of base layer [μm] | Xr (rake face) | Xe (cutting edge) | Xr-Xe | Average of periodic widths [nm] | Cross-sectional formulation | Content rate of cubic crystal [vol %] | Thickness of TiSiCN layer [μm] | Thickness of intermediate layer [μm] | Thickness of surface layer [μm] | Cutting test Tool lifetime [min] |
| --- | --- | --- | --- | --- | --- | --- | --- | --- | --- | --- | --- |
| 3-1 | 0.3 | 0.100 | 0.097 | 0.003 | — | Granular structure | 83 | 1.2 | 0.5 | 2.0 | 32 |
| 3-2 | 0.3 | 0.100 | 0.097 | 0.003 | — | Granular structure | 83 | 16 | 0.5 | 2.0 | 32 |
| 3-101 | 0.3 | 0.097 | 0.097 | 0 | — | Granular structure | 83 | 1.2 | 0.5 | 2.0 | 25 |
| 3-102 | 0.3 | 0.100 | 0.100 | 0 | — | Granular structure | 83 | 1.2 | 0.5 | 2.0 | 22 |
| 3-103 | 0.3 | 0.099 | 0.097 | 0.002 | — | Granular structure | 83 | 1.2 | 0.5 | 2.0 | 24 |
| 3-104 | 0.3 | 0.101 | 0.097 | 0.004 | — | Granular structure | 83 | 1.2 | 0.5 | 2.0 | 24 |
| 3-3 | 0.3 | 0.100 | 0.097 | 0.003 | 2 | Granular structure | 83 | 1.2 | 0.5 | 2.0 | 37 |
| 3-4 | 0.3 | 0.100 | 0.097 | 0.003 | 21 | Granular structure | 83 | 1.2 | 0.5 | 2.0 | 38 |
| 3-5 | 0.3 | 0.100 | 0.097 | 0.003 | 3 | Granular structure | 83 | 1.2 | 0.5 | 2.0 | 41 |
| 3-6 | 0.3 | 0.100 | 0.097 | 0.003 | 20 | Granular structure | 83 | 1.2 | 0.5 | 2.0 | 41 |
| 3-7 | 0.3 | 0.100 | 0.097 | 0.003 | — | Pillar structure | 83 | 1.2 | 0.5 | 2.0 | 40 |
| 3-8 | 0.3 | 0.100 | 0.097 | 0.003 | — | Granular structure | 96 | 1.2 | 0.5 | 2.0 | 41 |
| 3-9 | 0.3 | 0.100 | 0.097 | 0.003 | — | Granular structure | 83 | 2.0 | 0.5 | 2.0 | 34 |
| 3-10 | 0.3 | 0.100 | 0.097 | 0.003 | — | Granular structure | 83 | 15 | 0.5 | 2.0 | 39 |
| 3-10-1 | — | 0.100 | 0.097 | 0.003 | — | Granular structure | 83 | 15 | 0.5 | 2.0 | 37 |
| 3-10-2 | 0.3 | 0.100 | 0.097 | 0.003 | — | Granular structure | 83 | 15 | — | — | 38 |
| 3-10-3 | — | 0.100 | 0.097 | 0.003 | — | Granular structure | 83 | 15 | — | — | 38 |

By performing the above steps, the cutting tools of Samples 3-1 to 3-10-3 and 3-101 to 3-104 that had constitutions shown in Table 15 were produced.

<<Evaluation>>

Of the cutting tool of each Sample, Xr; Xe; A:B, an average of periodic widths of a lamellar structure; whether the TiSiCN layer had a pillar structure or not; the content rate of a cubic structure; and the thickness of the TiSiCN layer were measured.

<Measurements of Xr and Xe>

Of the cutting tools of Samples 3-1 to 3-10-3 and 3-101 to 3-104, the Xr was determined by the method described in Embodiment 1. Each of the obtained results is shown in "Xr (rake face)" of Table 15. Of the cutting tools of Samples 3-1 to 3-10-3 and 3-101 to 3-104, the Xe was determined by the method described in Embodiment t. Each of the obtained results is shown in "Xe (cutting edge)" of Table 15.

<Measurement of A:B>

Of the cutting tools of Samples 3-1 to 3-10-3 and 3-101 to 3-104, the A:B was determined by the method described in Embodiment 1. As a result, it has been confirmed that all the cutting tools of Samples 3-1 to 3-10-3 and 3-101 to 3-104 have the ratio A:B of A:B=1.0.8 to 1.1. Of the cutting tools of Samples 3-1 to 3-10-3 and 3-101 to 3-104, the A:B in the second TiSiCN layer was determined by the method described in Embodiment 1. As a result, it has been confirmed that all the cutting tools of Samples 3-1 to 3-10-3 and 3-101 to 3-104 have the ratio A:B in the second TiSiCN layer of A:B=1:0.8 to 1.1.

<Measurement of Average of Periodic Widths of Lamellar Structure>

Of the cutting tools of Samples 3-1 to 3-10-3 and 3-101 to 3-104, the average of the periodic widths of the lamellar structure was determined by the method described in Embodiment 1. Each of the obtained results is shown in "Average of periodic widths [nm]" of Table 15.

<Specification of Whether TiSiCN Layer has Pillar Structure or Not>

Of the cutting tools of Samples 3-1 to 3-10-3 and 3-101 to 3-104, whether the TiSiCN layer had a pillar structure or not was determined by the method described in Embodiment 1. Each of the obtained results is shown in "Cross-sectional formulation" of Table 15 In "Cross-sectional formulation" in Table 15, "Pillar structure" is referred to "TiSiCN layer having a pillar structure" (in other words, an average aspect ratio of the hard particles is 3 or more), and "Granular structure" is referred to "TiSiCN layer having no pillar structure" (in other words, an average aspect ratio of the hard particles is less than 3).

<Measurement of Content Rate of Cubic Crystalline Structure in TiSiCN Layer>

Of the cutting tools of Samples 3-1 to 3-10-3 and 3-101 to 3-104, the content rate of the cubic crystalline structure in the TiSiCN layer was determined by the method described in Embodiment 1. Each of the obtained results is shown in "Content rate of cubic crystal [vol %]" of Table 15.

<Measurements of Thickness of Base Layer, Thickness of TiSiCN Layer, Thickness of Intermediate Layer, and Thickness of Surface Layer>

Of the cutting tools of Samples 3-1 to 3-10, 3-10-2, and 3-101 to 3-104, the thickness of the base layer was determined by the method described in Embodiment 1. Each of the obtained results is shown in "Thickness of base layer [μm]" of Table 15. Of the cutting tools of Samples 3-1 to 3-10-3, and 3-101 to 3-104, the thickness of the TiSiCN layer was determined by the method described in Embodiment 1. Each of the obtained results is shown in "Thickness of TiSiCN layer [μm]" of Table 15 Of the cutting tools of Samples 3-1 to 3-10-1, and 3-101 to 3-104, the thickness of the intermediate layer was determined by the method described in Embodiment 1. Each of the obtained results is shown in "Thickness of intermediate layer [μm]" of Table 15. Of the cutting tools of Samples 3-1 to 3-10-1, and 3-101 to 3-104, the thickness of the surface layer was determined by the method described in Embodiment 1. Each of the obtained results is shown in "Thickness of surface layer [μm]" of Table 15.

<Cutting Test>

Using the cutting tools of Samples 3-1 to 3-10-3 and 3-101 to 3-104, a cutting time until a wear amount (Vb) of the flank face reached 0.20 mm under the following cutting condition was measured, and a final damage form of the cutting edge was observed. Each of the obtained results is shown in "Tool lifetime [min]" of Table 15. A longer cutting time indicates a longer tool lifetime.

(Cutting Condition)

Workpiece: SUJ2 round bar material
Peripheral speed: 200 m/min
Feeding rate: 0.3 mm/rev
Cutting depth: 1.5 mm
Cutting liquid: present This cutting condition corresponds to the intermittent turning of steel.

<Result>

The cutting tools of Samples 3-1 to 3-10-3 correspond to Examples. Samples 3-101 to 3-104 correspond to Comparative Examples. It has been confirmed that the cutting tools of Samples 3-1 to 3-10-3 (Examples) have a longer tool lifetime than the cutting tools of Samples 3-101 to 3-104 (Comparative Examples) even in the intermittent turning of steel.

From the above, it has been found that the cutting tools of Samples 1-1 to 1-12-3, 2-1 to 2-11-3, and 3-1 to 3-10-3 have a long tool lifetime even in the intermittent turning of steel.

Although the embodiments and Examples of the present disclosure have been described as above, it is previously anticipated that the constituents of each of the aforementioned embodiments and Examples are appropriately combined or variously modified.

The disclosed embodiments and Examples herein are examples in all points, and should be non-limitative. The scope of the present invention is determined by not the above embodiments nor Examples but claims, and intended to include meaning equivalent to claims and all modification within the scope.

REFERENCE SINGS LIST 1 cutting tool, 2 substrate, 2a rake face, 2b flank face, 2c cutting edge, 3 coating film, 11 rake face, 12 flank face, 13 cutting edge, 30 TiSiCN layer, 31 another layer, 32 base layer, 33 intermediate layer, 34 surface layer, 50 CVD apparatus, 52 substrate-setting tool, 53 reaction chamber, 54 temperature controller, 55, 57 inlet, 59 exhaust pipe, 60 exhaust port, 61 first jetting port, 62 second jetting port, 63 third jetting port, E ridgeline that constitutes boundary between rake face and flank face, D distance (linear distance) from ridgeline or imaginary ridgeline, R imaginary plane that includes rake face, F imaginary plane that includes flank face, EE imaginary ridgeline formed by crossing imaginary plane R and imaginary plane F, EF imaginary boundary line to be boundary of deviation between flank face and imaginary plane F, ER imaginary boundary line to be boundary of deviation between rake face and imaginary plane R, L1 line that bisects corner part, L2 line perpendicular to cutting edge of straight part, T, H arrow, HP height position of rake face of substrate

The invention claimed is:

1. A cutting tool comprising a substrate and a coating film disposed on the substrate, wherein the cutting tool comprises:
a rake face;
a flank face contiguous to the rake face; and
a cutting edge region composed of a boundary part between the rake face and the flank face, wherein
the coating film includes a TiSiCN layer,
the TiSiCN layer has:
a first TiSiCN layer positioned in the rake face; and
a second TiSiCN layer positioned in the cutting edge region,
the first TiSiCN layer has a composition of $Ti_{(1-Xr)}Si_{Xr}CN$,
the second TiSiCN layer has a composition of $Ti_{(1-Xe)}Si_{Xe}CN$, and
Xr and Xe each being an inclusive range of $0.0102 \geq Xr, Xe \geq 0.010$, and satisfy a relationship of $Xr-Xe \geq 0.003$.

2. The cutting tool according to claim 1, wherein
the TiSiCN layer of the coating film is composed of a plurality of hard particles, and
the hard particles have a lamellar structure in which a layer with a relatively high silicon concentration and a layer with a relatively low silicon concentration are alternately stacked.

3. The cutting tool according to claim 2, wherein an average of periodic widths, $PW_{avg}$, of the lamellar structure is in an inclusive range of $20 \text{ nm} \geq PW_{avg} \geq 2:3 \text{ nm}$.

4. The cutting tool according to claim 1, wherein the first TiSiCN layer or the second TiSiCN layer has a pillar structure.

5. The cutting tool according to claim 1, wherein the TiSiCN layer of the coating film has 90 vol % or more of a cubic crystalline structure.

6. The cutting tool according to any one claim 1, wherein the TiSiCN layer of the coating film has a thickness in an inclusive range of $15 \text{ μm} \geq \text{thickness} \geq 2.0 \text{ μm}$.

* * * * *

UNITED STATES PATENT AND TRADEMARK OFFICE
CERTIFICATE OF CORRECTION

PATENT NO. : 11,975,391 B2
APPLICATION NO. : 18/026595
DATED : May 7, 2024
INVENTOR(S) : Fumiyoshi Kobayashi It is certified that error appears in the above-identified patent and that said Letters Patent is hereby corrected as shown below:

In the Claims

Column 40, Line 1-2, should be changed "Xr and Xe each being an inclusive range of $0.0102 \geq Xr, Xe \geq 0.010$" to -- Xr and Xe each being in an inclusive range of $0.100 \geq Xr, Xe \geq 0.010$ --.

Column 40, Line 12, should be changed "$20 \text{ nm} \geq PWavg \geq 2:3 \text{ nm}$" to -- $20 \text{ nm} \geq PWavg \geq 3 \text{ nm}$ --.

Column 40, Line 13-14, should be changed "wherein the first TiSiCN layer" to -- wherein at least one of the first TiSiCN layer --.

Column 40, Line 19, should be changed "The cutting tool according to any one claim 1," to -- The cutting tool according to claim 1, --.

Signed and Sealed this
Sixth Day of August, 2024

Katherine Kelly Vidal
*Director of the United States Patent and Trademark Office*